US009246274B2

(12) United States Patent
Valenti et al.

(10) Patent No.: US 9,246,274 B2
(45) Date of Patent: Jan. 26, 2016

(54) COMMUNICATION CONNECTORS HAVING CROSSTALK COMPENSATION NETWORKS

(71) Applicant: Panduit Corp., Tinley Park, IL (US)

(72) Inventors: Joshua A. Valenti, Wheeling, IL (US); Moulik Shah, Chicago, IL (US); Ronald L. Tellas, Schererville, IN (US); Robert E. Fransen, Tinley Park, IL (US); Satish I. Patel, Roselle, IL (US); Tse-Yu Lin, Cupertino, CA (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 14/215,817

(22) Filed: Mar. 17, 2014

(65) Prior Publication Data
US 2014/0273638 A1 Sep. 18, 2014

Related U.S. Application Data

(60) Provisional application No. 61/791,134, filed on Mar. 15, 2013.

(51) Int. Cl.
*H01R 13/6466* (2011.01)
*H01R 24/64* (2011.01)
*H05K 1/02* (2006.01)
*H05K 1/16* (2006.01)

(52) U.S. Cl.
CPC ............ *H01R 13/6466* (2013.01); *H01R 24/64* (2013.01); *H05K 1/0228* (2013.01); *H01R 2201/04* (2013.01); *H05K 1/162* (2013.01); *H05K 1/165* (2013.01); *H05K 2201/09236* (2013.01); *H05K 2201/09672* (2013.01); *H05K 2201/10189* (2013.01); *H05K 2201/10303* (2013.01)

(58) Field of Classification Search
USPC ............ 439/620.22, 620.11, 620.13, 620.17, 439/676
See application file for complete search history.

(56) References Cited

U.S. PATENT DOCUMENTS

| 5,295,869 | A |   | 3/1994  | Siemon et al. |
|-----------|---|---|---------|---------------|
| 5,299,956 | A | * | 4/1994  | Brownell et al. ............. 439/638 |
| 5,310,363 | A |   | 5/1994  | Brownell et al. |
| 5,459,643 | A |   | 10/1995 | Siemon et al. |
| 5,474,474 | A |   | 12/1995 | Siemon et al. |
| 5,547,405 | A | * | 8/1996  | Pinney et al. .................. 439/894 |
| 5,687,233 | A | * | 11/1997 | Loudermilk et al. ......... 379/442 |
| 5,769,647 | A | * | 6/1998  | Tulley et al. .................. 439/144 |

(Continued)

FOREIGN PATENT DOCUMENTS

| KR | 1020000082870 | 4/2007 |
| WO | 2008109924    | 9/2008 |
| WO | 2008109926    | 9/2008 |

*Primary Examiner* — Alexander Gilman
(74) *Attorney, Agent, or Firm* — Christopher S. Clancy; Yuri Astvatsaturov

(57) ABSTRACT

The present invention generally relates to the field of network communications, and more specifically to networks for crosstalk reduction/compensation and communication connectors which employ such networks. In an embodiment, the present invention is an RJ45 jack with an orthogonal compensation network to meet CAT6A or higher performance standard. For the 3:6-4:5 wire-pair combination, the orthogonal compensation network begins in the jack nose (plug interface contact (PIC)) section, and utilizes a flexible printed circuit board in the nose section, split PIC contacts in the rear nose, and circuitry in the rigid printed circuit board to create the orthogonal compensation network.

25 Claims, 48 Drawing Sheets

(56) References Cited

U.S. PATENT DOCUMENTS

| | | | |
|---|---|---|---|
| 5,797,764 A | 8/1998 | Coulombe et al. | |
| 5,924,899 A | 7/1999 | Paagman | |
| 5,938,479 A | 8/1999 | Paulson et al. | |
| 5,967,853 A | 10/1999 | Hashim | |
| 5,997,358 A | 12/1999 | Adriaenssens et al. | |
| 6,042,427 A | 3/2000 | Adriaenssens et al. | |
| 6,050,842 A | 4/2000 | Ferrill et al. | |
| 6,089,923 A * | 7/2000 | Phommachanh | 439/676 |
| 6,097,262 A * | 8/2000 | Combellack | 333/12 |
| 6,099,357 A | 8/2000 | Reichle | |
| 6,270,381 B1 | 8/2001 | Adriaenssens et al. | |
| 6,336,830 B1 | 1/2002 | Lee | |
| 6,368,144 B2 | 4/2002 | Vilund | |
| 6,409,547 B1 | 6/2002 | Reede | |
| 6,443,776 B2 | 9/2002 | Reichle | |
| 6,520,808 B2 | 2/2003 | Forbes et al. | |
| 6,866,548 B2 | 3/2005 | Hashim | |
| 6,964,587 B2 | 11/2005 | Colantuono et al. | |
| 7,040,925 B2 * | 5/2006 | Beerwerth et al. | 439/620.02 |
| 7,052,328 B2 * | 5/2006 | Ciezak et al. | 439/676 |
| 7,140,924 B2 | 11/2006 | Redfield et al. | |
| 7,153,163 B2 * | 12/2006 | Lewis et al. | 439/620.11 |
| 7,153,168 B2 * | 12/2006 | Caveney et al. | 439/676 |
| 7,166,000 B2 | 1/2007 | Pharney | |
| 7,168,993 B2 * | 1/2007 | Hashim | 439/676 |
| 7,172,466 B2 | 2/2007 | Aekins et al. | |
| 7,175,476 B2 | 2/2007 | Kim et al. | |
| 7,186,149 B2 | 3/2007 | Hashim | |
| 7,190,594 B2 | 3/2007 | Hashim et al. | |
| 7,204,722 B2 | 4/2007 | Hashim et al. | |
| 7,301,780 B2 | 11/2007 | AbuGhazaleh et al. | |
| 7,314,393 B2 | 1/2008 | Hashim | |
| 7,317,318 B2 | 1/2008 | Jackson | |
| 7,320,624 B2 | 1/2008 | Hashim et al. | |
| 7,357,683 B2 * | 4/2008 | Caveney et al. | 439/894 |
| 7,364,470 B2 | 4/2008 | Hashim | |
| 7,367,849 B2 * | 5/2008 | Wang et al. | 439/676 |
| 7,452,246 B2 | 11/2008 | Caveney et al. | |
| 7,481,678 B2 * | 1/2009 | Aekins | H01R 13/7033 439/620.11 |
| 7,485,010 B2 * | 2/2009 | Aekins | 439/676 |
| 7,500,883 B2 | 3/2009 | Ciezak et al. | |
| 7,601,034 B1 * | 10/2009 | Aekins et al. | 439/676 |
| 7,635,285 B2 | 12/2009 | Carroll et al. | |
| 7,682,203 B1 * | 3/2010 | Pharney et al. | 439/676 |
| 7,736,195 B1 * | 6/2010 | Poulsen | H01R 13/6658 439/676 |
| 7,780,480 B2 * | 8/2010 | Caveney | 439/676 |
| 7,787,615 B2 * | 8/2010 | Hammond et al. | 379/417 |
| 7,824,231 B2 | 11/2010 | Marti et al. | |
| 7,856,709 B2 * | 12/2010 | Bresche et al. | 29/847 |
| 7,874,878 B2 * | 1/2011 | Fite et al. | 439/676 |
| 7,914,333 B2 | 3/2011 | Verding | |
| 7,914,346 B2 | 3/2011 | Pharney et al. | |
| 7,927,153 B2 * | 4/2011 | Straka | H01R 13/6625 439/676 |
| 7,976,349 B2 | 7/2011 | Heckmann | |
| 8,277,262 B2 | 10/2012 | Busse | |
| 8,641,452 B2 * | 2/2014 | Patel et al. | 439/620.23 |
| RE44,961 E * | 6/2014 | Phommachanh | 439/676 |
| 8,808,036 B2 * | 8/2014 | Xu | 439/676 |
| 8,920,199 B2 * | 12/2014 | Schumacher et al. | 439/752 |
| 8,951,072 B2 * | 2/2015 | Hashim et al. | 439/676 |
| 2005/0136747 A1 * | 6/2005 | Caveney et al. | 439/676 |
| 2005/0181676 A1 * | 8/2005 | Caveney et al. | 439/676 |
| 2006/0014410 A1 * | 1/2006 | Caveney | 439/188 |
| 2009/0104821 A1 * | 4/2009 | Marti et al. | 439/676 |
| 2009/0163084 A1 * | 6/2009 | Straka et al. | 439/676 |
| 2009/0243757 A1 * | 10/2009 | Xu et al. | 333/177 |

* cited by examiner

COMMUNICATION CONNECTORS HAVING CROSSTALK COMPENSATION NETWORKS

CROSS-REFERENCE TO RELATED APPLICATIONS

This application claims the benefit of U.S. Provisional Patent Application No. 61/791,134, filed on Mar. 15, 2013, Which is incorporated herein by reference in its entirety.

FIELD OF INVENTION

The present invention generally relates to the field of network communications, and more specifically to networks for crosstalk reduction/compensation and communication connectors which employ such networks.

BACKGROUND

The evolution of computing has witnessed a significant shift in the importance of networks. An ever-increasing quantity of information is constantly being gathered, stored, and shared among a wide range of users. In addition to the sheer growth of data, users have come to expect quicker access to this information. This combination of size and speed has created a need for network infrastructure capable of supporting a high data rate.

Current networks readily employ jacks and plugs, and other communication connectors. These connectors typically include closely spaced parallel conductors which allow the jack and the plug to interface to each other. Conventional communication connectors have been used in relatively low data rate applications with relatively few problems. However, as transmission frequency and data rates increase, crosstalk (particularly near-end crosstalk (NEXT)) due to capacitive and inductive couplings among the closely spaced parallel conductors within the jack and/or plug has become increasingly problematic.

Therefore, it is desirable to have communication connectors capable of achieving improved performance.

SUMMARY

Accordingly, embodiments of the present invention are directed to communication connectors and/or internal components thereof.

In an embodiment, the present invention is an RJ45 jack with an orthogonal compensation network to meet CAT6A or higher performance. For the 3:645 wire-pair combination disclosed, the orthogonal compensation network begins in the jack nose (plug interface contact (PIC)) section, and utilizes a flexible printed circuit board in the nose section, split PIC contacts in the rear nose, and circuitry in the rigid printed circuit board to create the orthogonal compensation network.

In another embodiment, the present invention is a communication connector that includes a printed circuit board (PCB), plug interface contacts (PICs) having plug contact mating points, the PICs being connected to the PCB, cable connector contacts, and a circuitry connecting each of the plug interface contacts from respective the plug contact mating points to respective the cable connector contacts. The circuitry includes signal conductors between respective plug contact mating points of respective plug interface contacts and respective cable connector contacts, the signal conductors including a first signal pair and a second signal pair. The circuitry also includes a first combined mutually inductive and capacitive coupling between a first signal conductor of the first signal pair and a second signal conductor of the second signal pair. And the circuitry also includes a shunt capacitive coupling connecting the first signal conductor of the first signal pair and a second signal conductor of the first signal pair. Wherein the first combined coupling is generated in part in the PICs and in part on the PCB. In a variation of this embodiment, the communication connector is used in a communication system having communication equipment therein.

In yet another embodiment, the present invention is a communication connector that includes plug interface contacts, cable connector contacts, and a circuitry inclusive of and connecting respective the plug interface contacts to respective the cable connector contacts. The circuitry includes signal conductors inclusive of and between respective the plug interface contacts and respective the cable connector contacts, the signal conductors including a first signal conductor pair and a second signal conductor pair. The circuitry further includes a first network with a first combined mutually inductive and capacitive coupling between a first signal conductor of the first signal conductor pair and a second conductor of the second signal conductor pair. The circuitry also further includes a second network with a second combined mutually inductive and capacitive coupling between a second signal conductor of the first signal conductor pair and a first signal conductor of the second signal conductor pair. And the circuitry also further includes a shunt capacitive coupling connecting the first signal conductor of the first signal conductor pair and the second signal conductor of the first signal conductor pair. Wherein each of the plug interface contacts includes a plug contact, a printed circuit board contact, and an intermediate contact connecting respective the plug contact to respective the printed circuit board contact, at least one of the first network and the second network including at least some of the intermediate contacts. In a variation of this embodiment, the communication connector is used in a communication system having communication equipment therein.

In yet another embodiment, the present invention utilizes at least one of front rotated and back rotated PICs.

These and other features, aspects, and advantages of the present invention will become better-understood with reference to the following drawings, description, and any claims that may follow.

DETAILED DESCRIPTION

Figure 1:
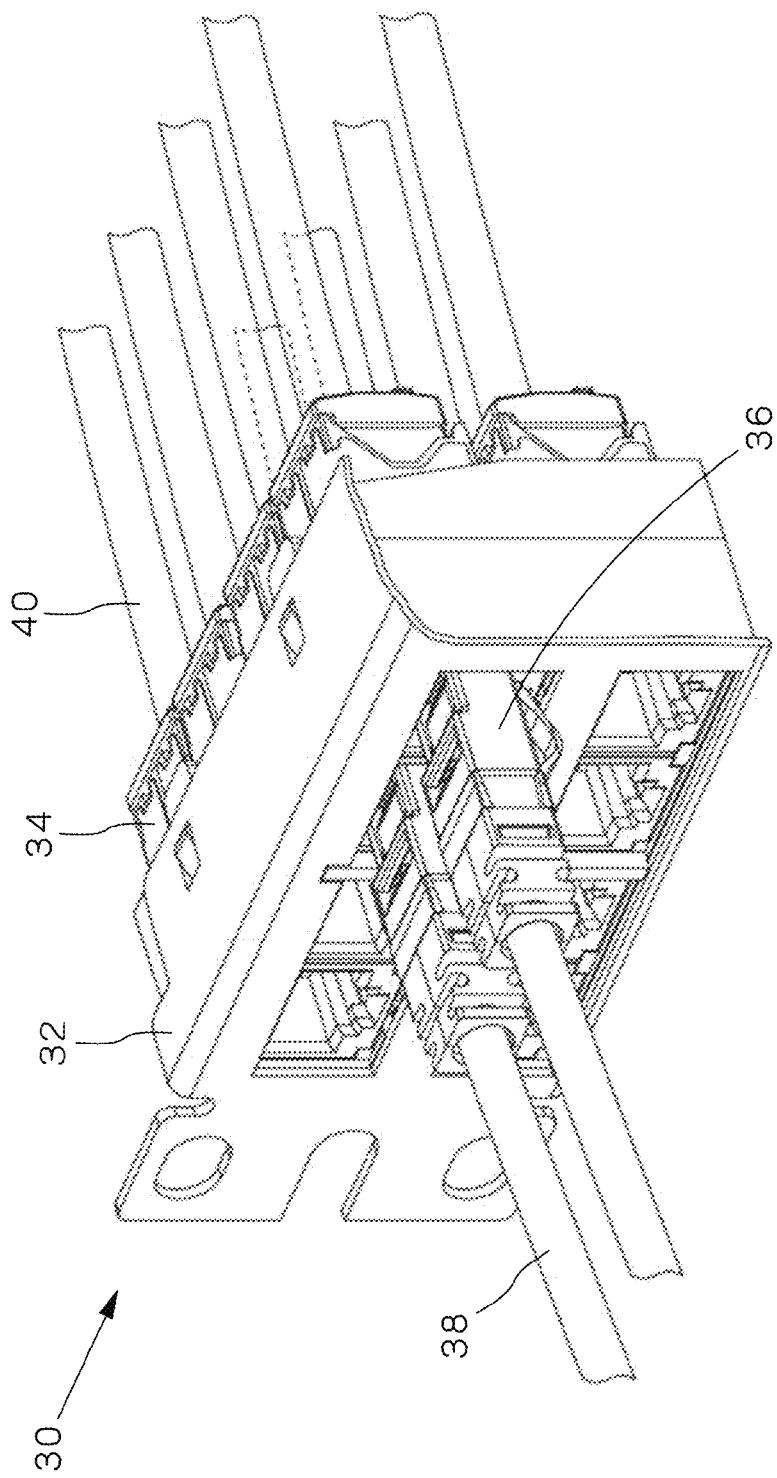
FIG. 1 illustrates a communication system according to an embodiment of the present invention.

As used herein, "opposite polarity" can be defined as being approximately 180 degrees out of phase in relation to a referenced polarity, and "orthogonal" can be defined as being approximately 90 degrees out of phase in relation to a referenced polarity. Also, as used herein, references to "shunting" can be defined as direct or indirect coupling of two conductors of the same differential pair via some means. For example, a shunting capacitive coupling on a wire pair (e.g., 3:6 wire pair) can refer to some form of a capacitive coupling (e.g., pad capacitor) positioned between a first conductor (e.g., conductor 3) and second conductor (e.g., conductor 6) of that wire pair. Note that indirect coupling may include intervening components such as offshoot traces. Furthermore, "conductor(s)," "signal conductor(s)," and "signal trace(s)" may be used interchangeably and shall be understood to refer to the same feature. Additionally, same reference numbers or designations may be used to reference like or similar (and non-identical) elements through various embodiments. Moreover, the use of the term "concurrently" or the like is not necessarily mean to be absolute, but can instead mean a lack of a time delay that is significant enough to appreciably affect the analysis of a circuit.

In RJ45 plug/jack connector combinations, NEXT generally occurs between the neighboring conductors of differential pairs. The source of NEXT in an RJ45 plug/jack connector combination is generally the plug. This NEXT in the plug is primarily caused by the manner in which the plug conductors are laid out in accordance with ANSI/TIA-568-C.2. The plug layout causes unbalanced coupling between conductor pairs which creates high levels of NEXT between conductor pairs 1:2 and 3:6, conductor pairs 3:6 and 4:5, and conductor pairs 3:6 and 7:8 that must be compensated for in the jack. In case of conductor pairs 1:2 and 3:6, plug NEXT can occur due to the coupling which can primarily exist between conductors 2 and 3; in case of conductor pairs 3:6 and 4:5, plug NEXT can occur due to the coupling which can primarily exist between conductors 3 and 4, and/or conductors 5 and 6; and in case of conductor pairs 3:6 and 7:8, plug NEXT can occur due to the coupling which can primarily exist between conductors 6 and 7.

The following exemplary embodiments illustrate how the present invention attempts to reduce or otherwise compensate for the crosstalk which may appear between differential pairs of a communication plug/jack combination. The present invention may rely in part on the principles of crosstalk compensation (generally described as orthogonal compensation network (OCN)) disclosed in U.S. patent application Ser. No. 13/681,480, filed on Nov. 20, 2012, entitled "COMPENSATION NETWORK USING AN ORTHOGONAL COMPENSATION NETWORK," and also in U.S. patent application Ser. No. 14/198,291, filed on Mar. 7, 2014, entitled "COMPENSATION NETWORKS AND COMMUNICATION CONNECTORS USING SAID COMPENSATION NETWORKS," both of which are incorporated herein by reference in their entirety. While at least some of the embodiments are described with reference to conductor pairs 4:5 and 3:6 of an RJ45 plug/jack connector combination having plug contacts laid out in accordance with ANSI/TIA-568-C.2, it should be understood that the same principles of crosstalk compensation can be applied to other differential pairs of such a plug/jack combination (e.g., conductor pairs 3:6 and 1:2, and conductor pairs 3:6 and 7:8) or to other connectors which employ differential pair transmission.

An exemplary embodiment of the present invention is illustrated in FIG. 1, which shows a communication system 30, which includes a patch panel 32 with jacks 34 and corresponding RJ45 plugs 36. Respective cables 38 are terminated to plugs 36, and respective cables 40 are terminated to jacks 34. Once a plug 36 mates with a jack 34 data can flow in both directions through these connectors. Although the communication system 30 is illustrated in FIG. 1 as having a patch panel, alternative embodiments can include other active or passive equipment. Examples of passive equipment can be, but are not limited to, modular patch panels, punch-down patch panels, coupler patch panels, wall jacks, etc. Examples of active equipment can be, but are not limited to, Ethernet switches, routers, semens, physical layer management systems, and power-over-Ethernet equipment as can be found in data centers and or telecommunications rooms; security devices (cameras and other sensors, etc.) and door access equipment; and telephones, computers, fax machines, printers, and other peripherals as can be found in workstation areas. Communication system 30 can further include cabinets, racks, cable management and overhead routing systems, and other such equipment.

Figure 2:
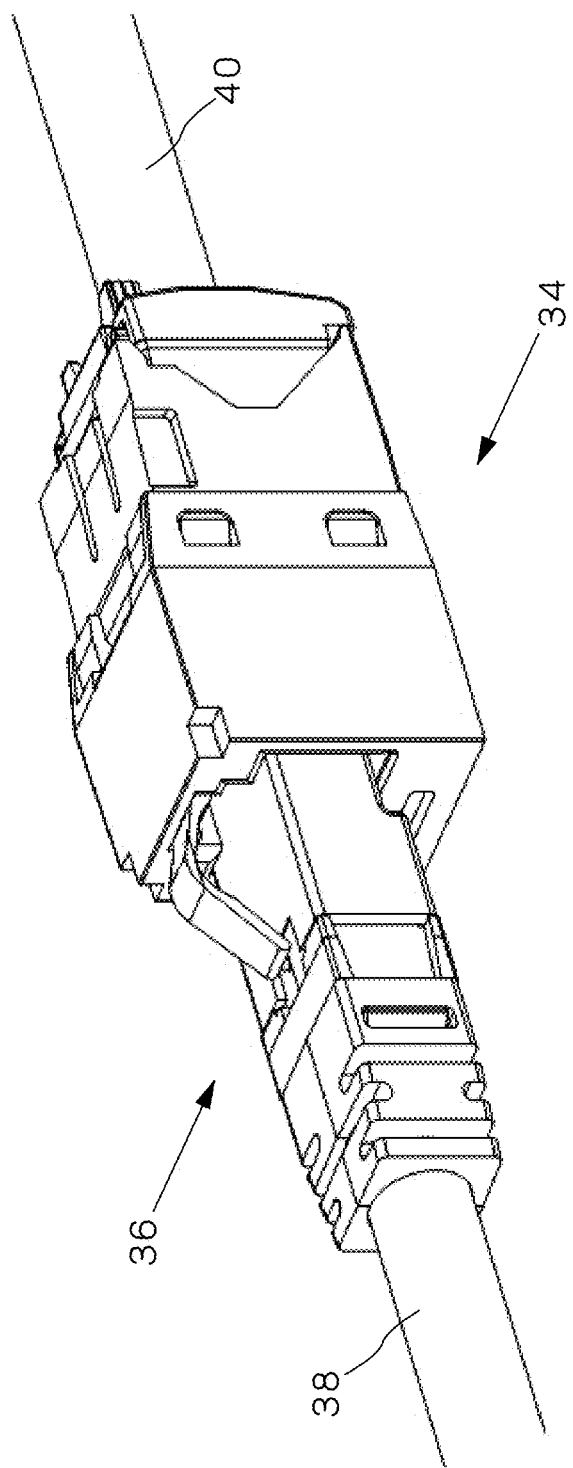
FIG. 2 illustrates a plug and jack combination according to an embodiment of the present invention.

The jack and plug combination of FIG. 1 is also shown in FIG. 2 which illustrates the network jack 34 mated with the RJ45 plug 36. Note that in this figure, the orientation of the network jack 34 and the RJ45 plug 36 is rotated 180° about the central axis of cable 40 as compared to the orientation of FIG. 1.

Figure 3:
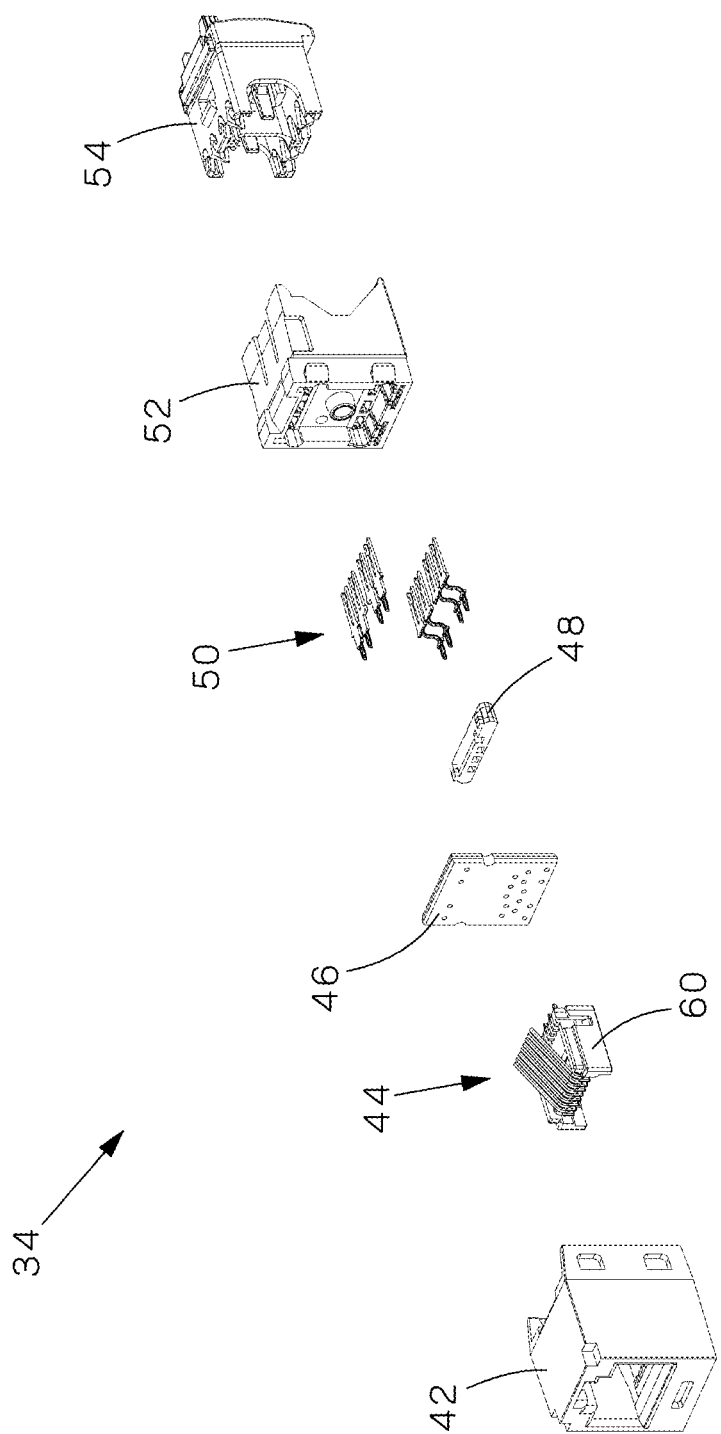
FIG. 3 illustrates an exploded view of a communication jack according to an embodiment of the present invention.

FIG. 3 illustrates an exploded view of the network jack 34, which includes a front housing 42, a front sled subassembly 44, a rigid printed circuit board (PCB) 46, an insulation displacement contact (IDC) support 48, IDCs 50, a rear housing 52, and a wire cap 54. Front sled subassembly 44 includes plug interface contacts (PICs) 56, PICs 58, a flexible circuit board 59, a top sled 60, and a bottom sled 61. In alternate embodiments, jack 34 can additionally include alien crosstalk-reducing materials such as a foil.

Figure 4:
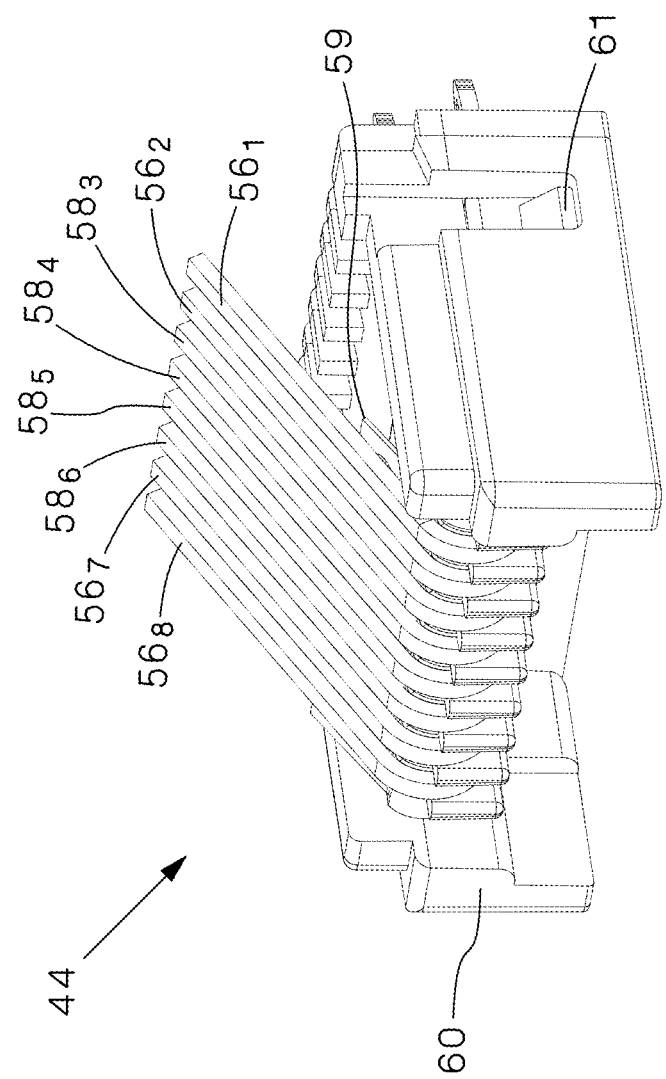
FIG. 4 illustrates a front isometric view of a front sled subassembly according to an embodiment of the present invention.
Figure 5:
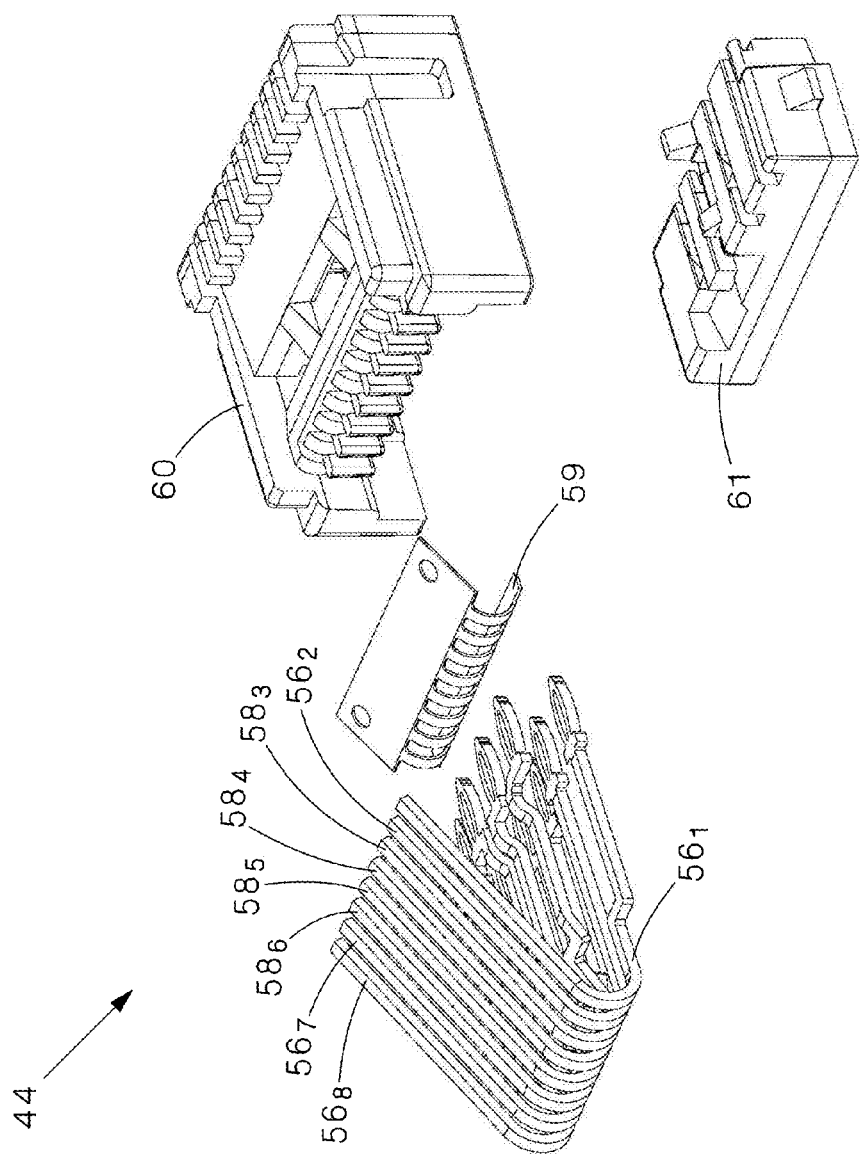
FIG. 5 illustrates an exploded view of the front sled subassembly of FIG. 4.

FIGS. 4 and 5 illustrate the front sled subassembly 44 with PICs 56, PICs 58, flexible circuit board 59, top sled 60, and bottom sled 61 in greater detail. The subscript numbers for each PIC 56 and 58 correspond to the RJ45 pin positions as defined by ANSI/TIA-568-C.2.

Figure 6:
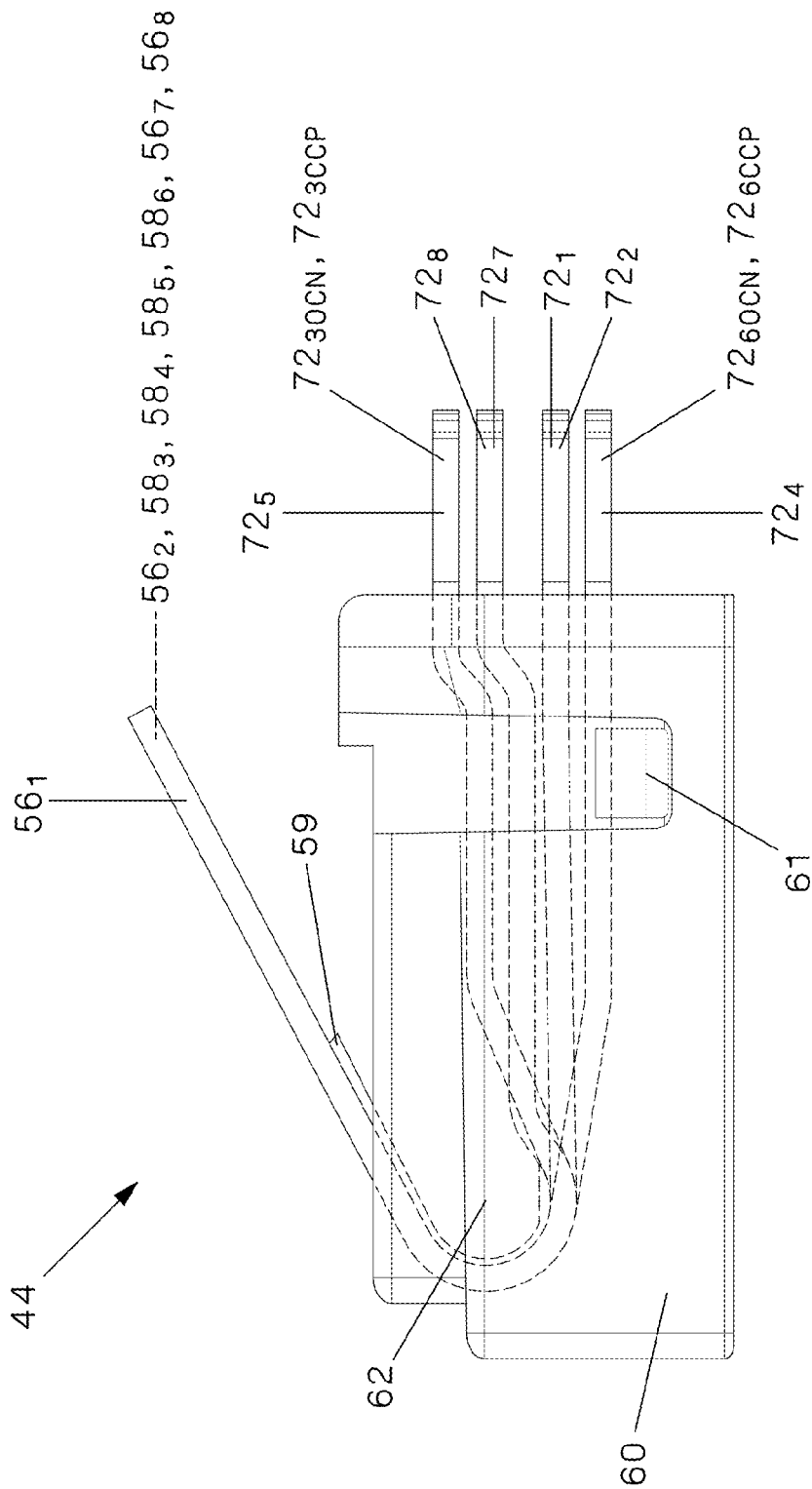
FIG. 6 illustrates a side profile view of the front sled subassembly of FIG. 4.

A side view of the front sled subassembly 44 is shown in FIG. 6. PIC's 56 and 58 are wrapped around an inner mandrel 62 during assembly process. This traps the flexible circuit board 59 between the PICs 56,58 and the front section of the top sled 60, restraining and securing the flexible circuit board 59 in the process, and thereby providing an electrical contact between the PICs and conductive components of the flexible circuit board 59. PICs 56 and 58 use compliant pins 72 to electrically interface with the rigid circuit board 46. The subscript numbers of each complaint pin 72 represents RJ45 pin positions as defined by ANSI/TIA-568 C.2. An extra subscript reference is assigned to the compliant pins of PICs $58_3$ and $58_6$ to differentiate between the offshoot traces used in the compensation network of the present invention ($72_{3OCN}$ or $72_{6OCN}$) and the signal carrying traces ($72_{3CCP}$ or $72_{6CCP}$) (note that the use of offshoot traces will be explained further later in the specification). Additionally, the PICs 56 and 58 include respective mid-sections 68, with each mid-section 68 employing the same subscript reference scheme as the compliant pins 72. The combination of a mid-section and a respective compliant pin may be referred to as an intermediate section, referring to a section of a PIC that is positioned between the PIC's plug contact region and the PCB. The front sled subassembly 44 staggers PICs 56 and 58 into four different planes in the region of compliant pins 72 as shown in FIG. 6. Complaint pins $72_{3CCP}$, $72_{3OCN}$, and $72_5$ are located on the highest plane (relative to the orientation shown in FIG. 6). Complaint pins $72_7$ and $72_8$ are on the second highest plane, compliant pins $72_1$ and $72_2$ are on the third highest plane, and complaint pins $72_4$, $72_{6CCP}$, and $72_{6OCN}$ are on the lowest plane.

Figure 7:
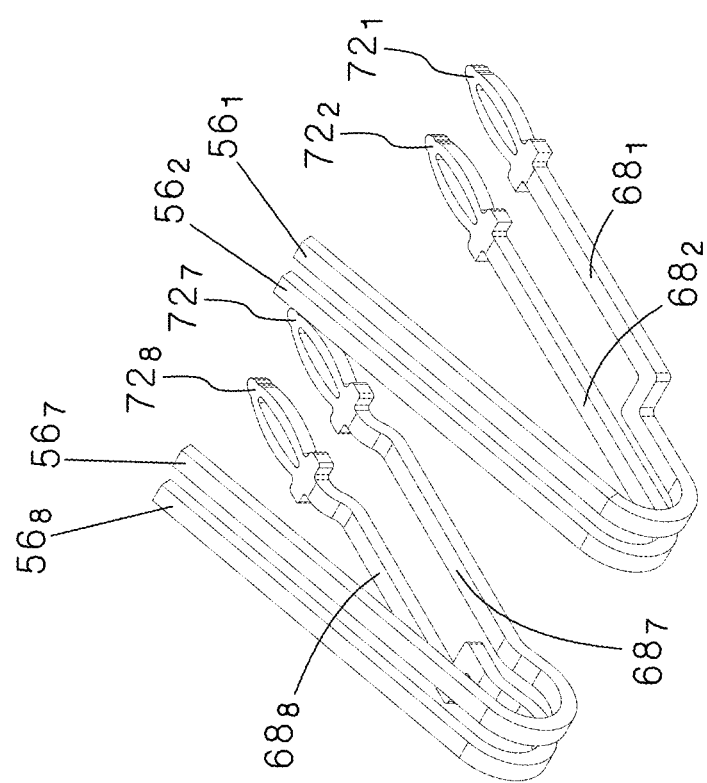
FIGS. 7, 8, and 9 illustrate the plug interface contacts used in the front sled subassembly of FIG. 4.
Figure 8:
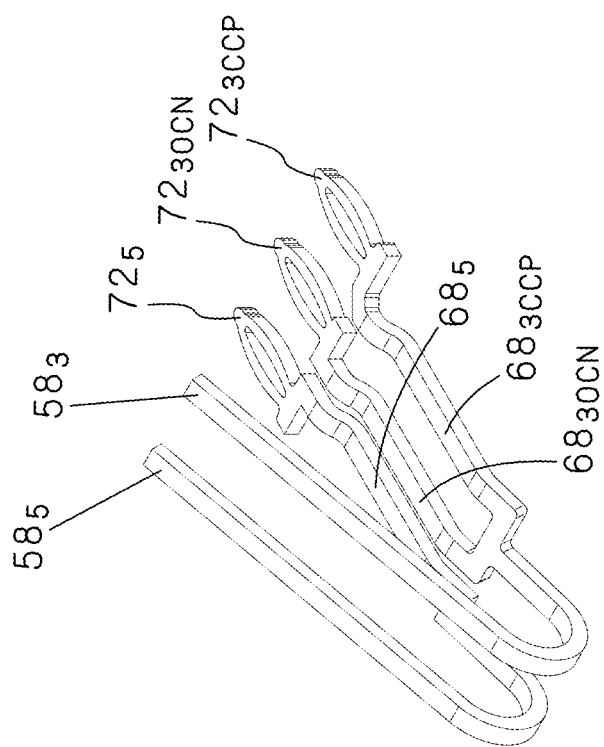
Figure 9:
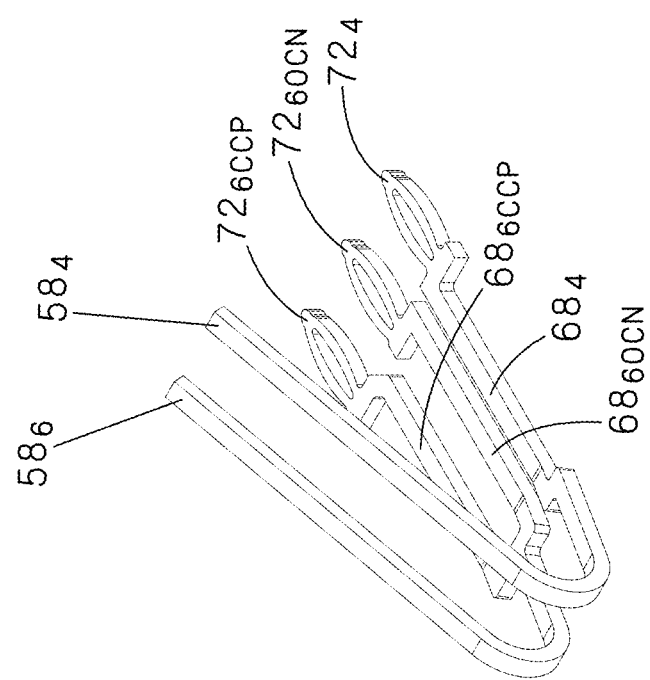

A front isometric view of PICs 56 can be seen in FIG. 7 and a front isometric view of PICs 58 can be seen in FIGS. 8-9. These views have been separated for clarity of the PICs' profiles. PICs $56_1$, $56_2$, $58_4$, $58_5$, $56_7$, and $56_8$ provide a path from corresponding plug contacts to corresponding signal traces positioned on and/or in the PCB 46. Each of these PICs acts as a respective signal trace between the plug and the PCB 46. Similar to the aforementioned PICs, PICs $58_3$ and $58_6$ also provide a path from corresponding plug contact to corresponding signal trace positioned on the PCB 46. However, each PIC $58_3$ and $58_6$ includes an offshoot trace ($68_{3OCCP}$, and $68_{6OCN}$, respectively) which branches off of the signal carrying portion ($68_{3CCP}$ and $68_{6CCP}$, respectively) of the PIC.

Figure 10:
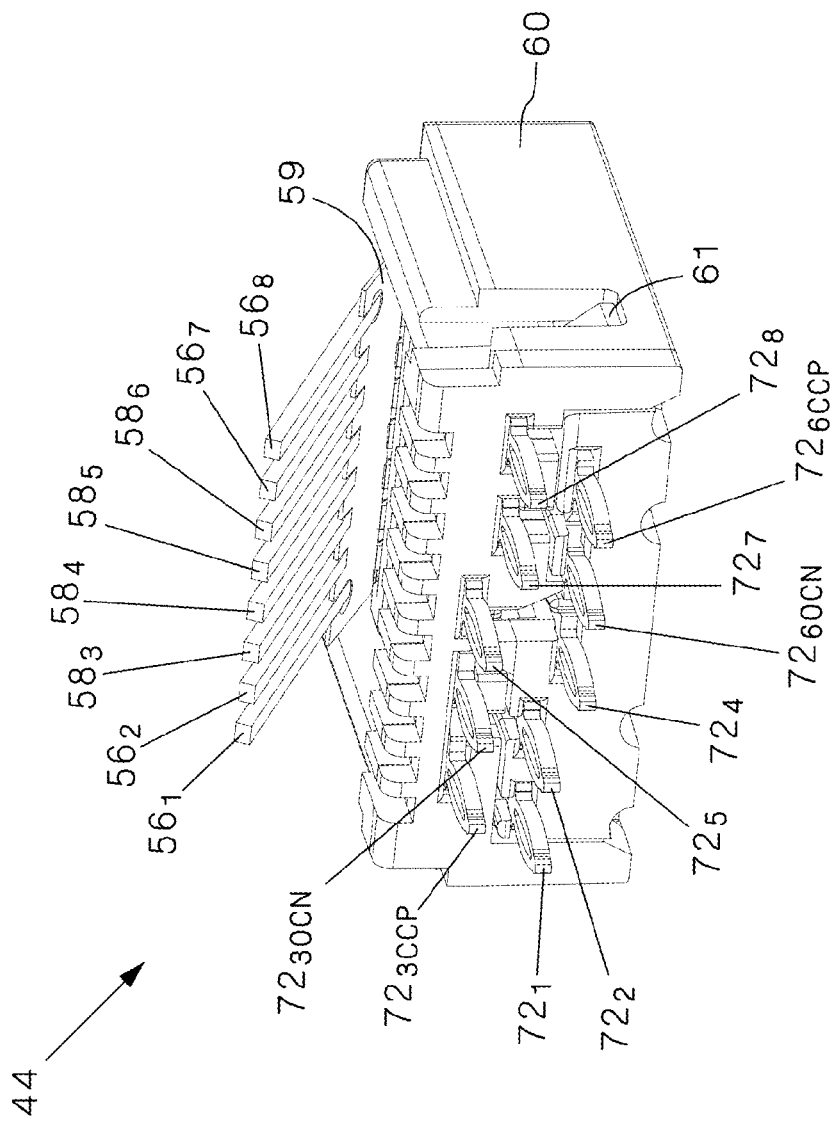
FIG. 10 illustrates a rear isometric view of the front sled subassembly of FIG. 4.
Figure 11:
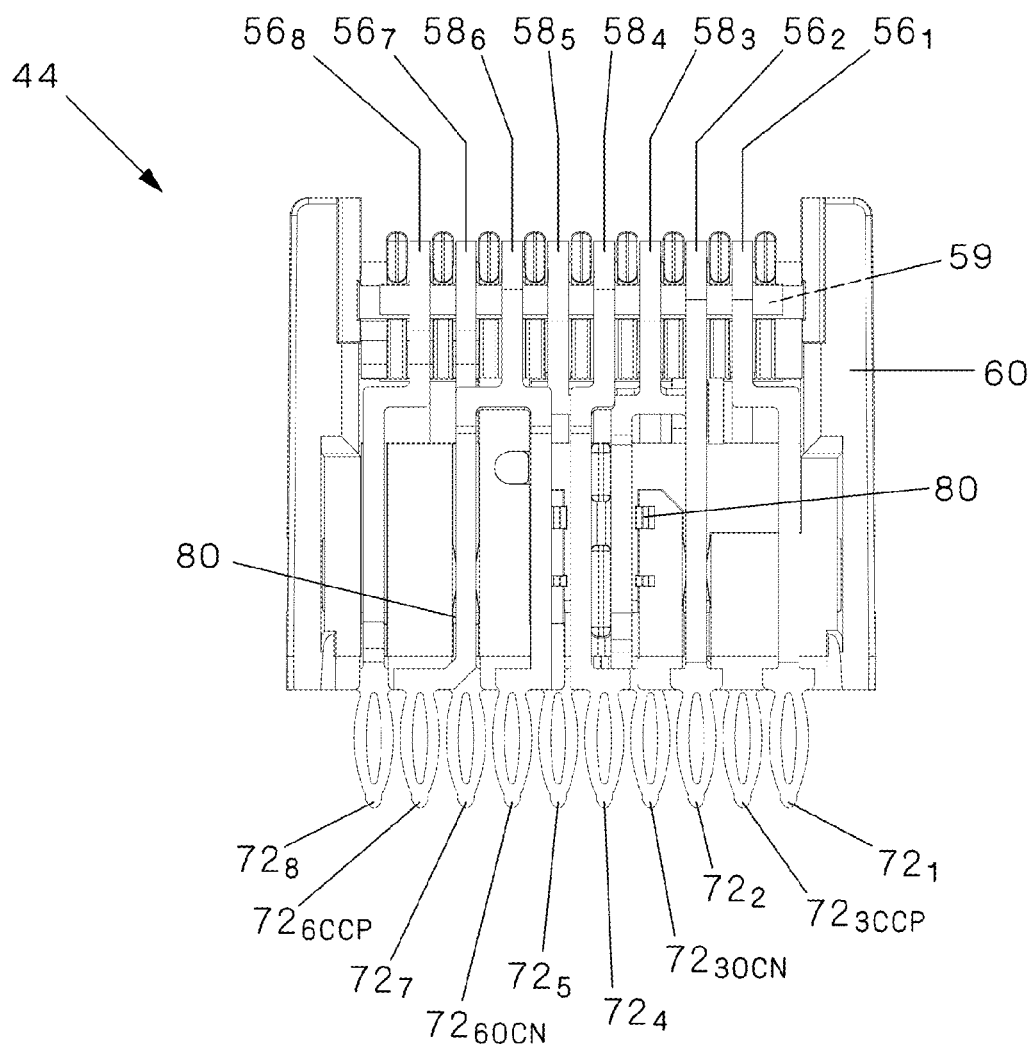
FIG. 11 illustrates a bottom view of the front sled subassembly of FIG. 4 with the bottom sled removed.

The general layout of the compliant pins 72 and their planar position can also be seen in the rear isometric view of front sled subassembly 44 shown in FIG. 10. FIG. 11 illustrates a bottom view of the front nose subassembly 44 with the bottom sled 61 removed for clarity. PICs 56 and 58 are affixed to both the top sled 60 and the bottom sled 61 through staking features 80. The PICs 56 and 58 are further secured by mating the bottom sled 61 to the top sled 60 via latches positioned on the sides of the bottom sled 61 and corresponding latching pockets positioned in the side walls of the top sled 60.

Prior to discussing the schematics shown in the current specification it is worth noting that while these schematics illustrate inductors and capacitors as discrete elements, in at least one embodiment, at least some of these elements represent the capacitive and inductive coupling occurring between various electrical traces. Such coupling is generally distributed and may, for example, include: (a) distributed coupling occurring as a result of two traces running within proximity to each other; (b) coupling occurring as a result of discrete elements such as, but not limited to, pad capacitors, finger capacitors, or other discrete capacitors; or (c) a combination thereof. Furthermore, while compensation needed for wire-pairs combinations other than the 3:6-4:5 wire-pair combination is not shown, this should not be viewed as limiting in any way. It is anticipated that any suitable compensation techniques may (but does not have to be) be used with the remaining wire-pair combinations. In an exemplary embodiment, compensation for wire-pair combinations 3:6-7:8 and/or 3:6-1:2 can employ at least one of OCN compensation techniques and simple compensation techniques, for example. Wire-pair combinations 4:5-7:8 and 4:5-1:2 may have a single stage of compensation, also entirely on the rigid board, for example. Pair 1:2-7:8 may not have compensation circuitry, for example. In a variation of this embodiment, the supporting circuitry can be implemented on at least one of the PICs, flexible circuit board 59, and rigid circuit hoard 46.

In one embodiment, the crosstalk compensation scheme of the present invention for the 4:5-3:6 wire-pair combination uses the pad capacitors on the flexible PCB 59 to create simple compensation, and the distributed capacitive and inductive couplings between elements of the PICs and between various traces on the rigid PCB 46 in combination with a shunting capacitance to create OCN compensation. In an embodiment, the combination of simple compensation and OCN compensation provides the overall desired compensation signal.

Figure 12:
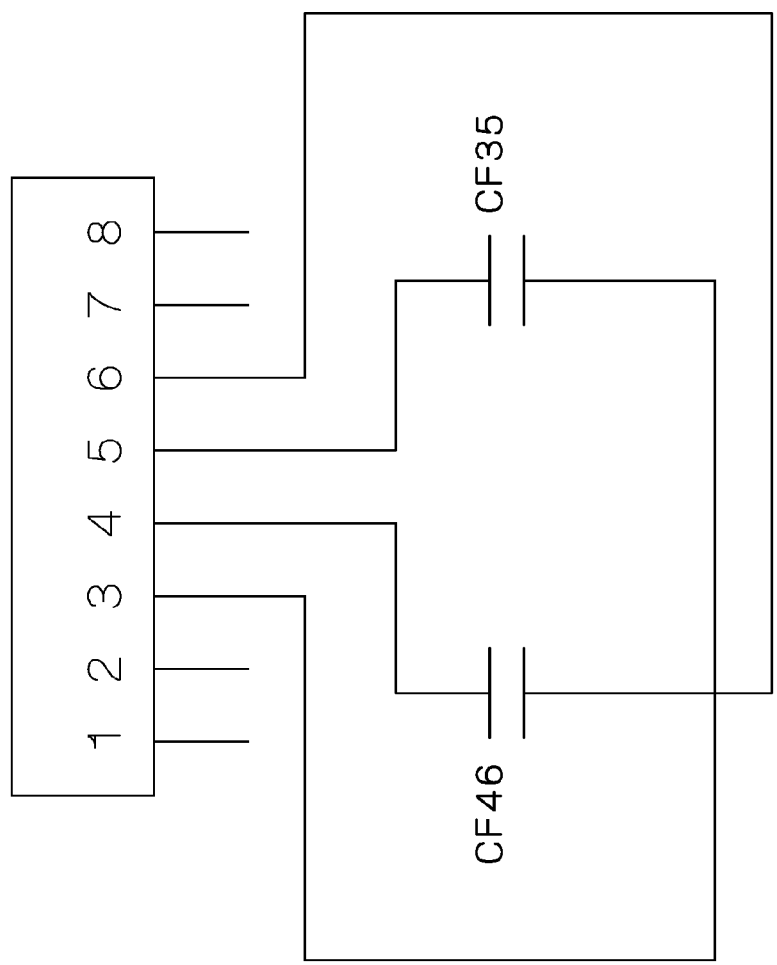
FIG. 12 illustrates a schematic view of a flex circuit board implemented in an embodiment of the present invention.
Figure 13:
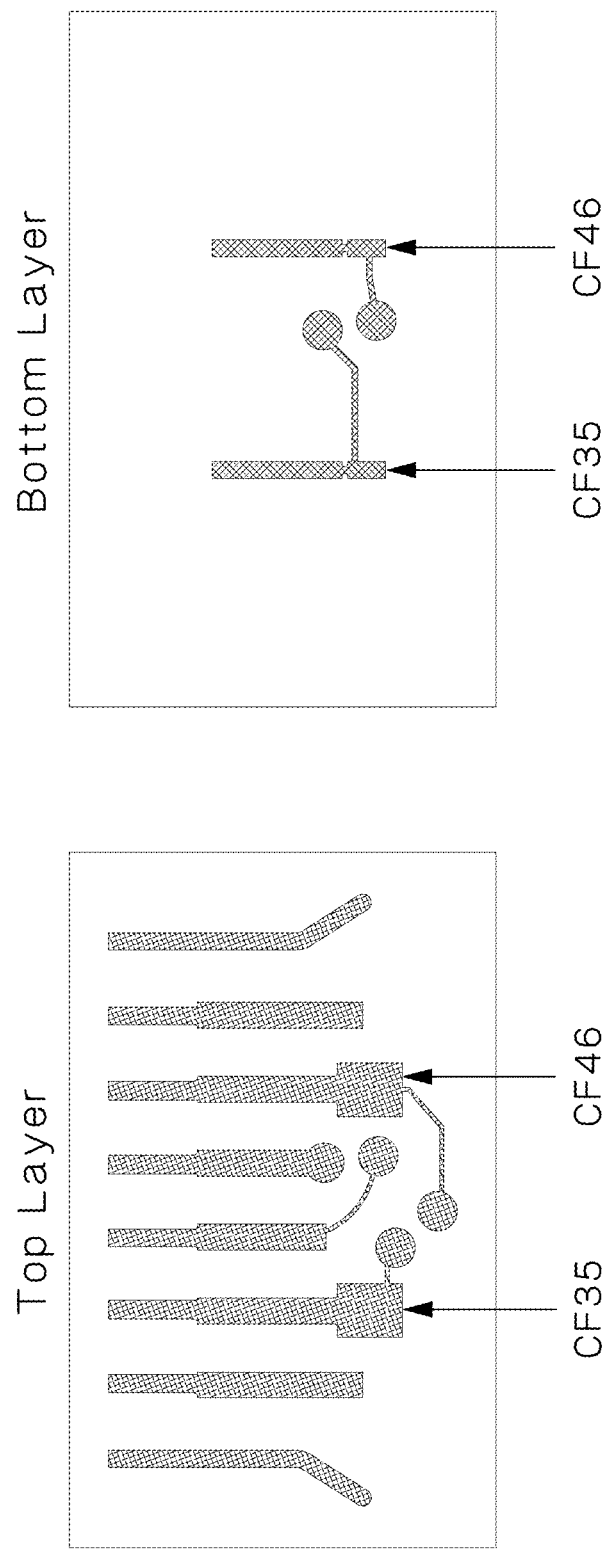
FIG. 13 illustrates the printed circuit board artwork for the flex circuit board of FIG. 12.
Figure 14:
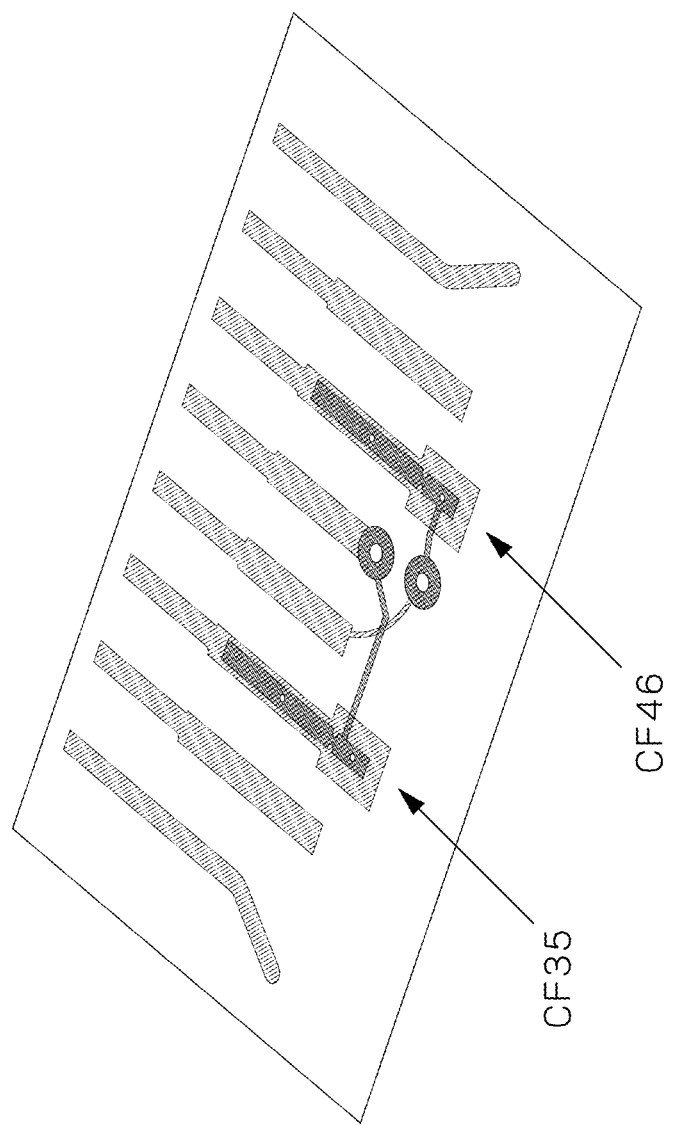
FIG. 14 illustrates an isometric view of the flex circuit board of FIG. 12.

Referring to FIGS. 12-14, the flexible PCB 59 includes capacitors CF35 and CF46. Due to the electrical contact between the PICs and the flexible PCB 59, capacitor C35 provides compensating coupling between PICs $58_3$ and $58_5$, and capacitor C46 provides compensating coupling between PICs $58_4$ and $58_6$. The CF35 and CF46 capacitors provide the simple compensation component of the currently described compensation scheme.

Figure 15:
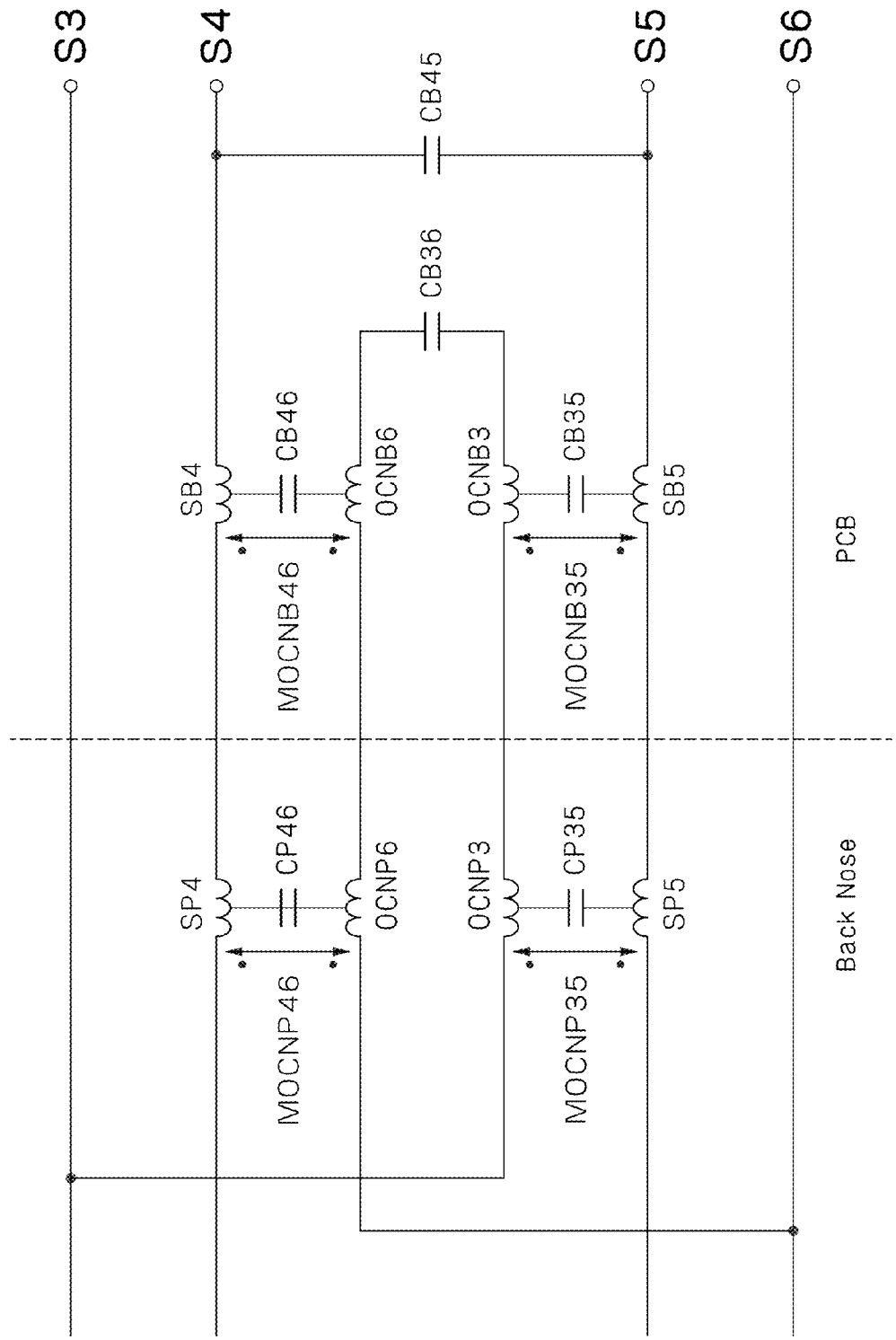
FIG. 15 illustrates a schematic view of a rigid circuit board implemented in an embodiment of the present invention.

Referring to FIG. 15, the OCN component of the overall compensation scheme is spanned across split contacts (including respective mid-sections 68 and compliant pins 72 of the PICs shown in FIGS. 7-9), and corresponding traces on the rigid PCB 46. In particular, the OCN uses signal traces S4 and S5, offshoot traces OCN3 and OCN6, and capacitor CB36 to create the desired signal. In the present case, the signal trace S4 includes the mid-section $68_4$ and the compliant pin $72_4$ of PIC $58_4$ (represented in the schematic as SP4), and at least a portion of the signal trace SB4 on the rigid PCB 46; the signal trace S5 includes the mid-section $68_5$ and the compliant pin $72_5$ of the PIC 58 (represented in the schematic as SP5), and at least a portion of the signal trace SB5 on the rigid PCB 46; the offshoot trace OCN3 includes the mid-section $68_{3OCN}$ and the compliant pin $72_{3OCN}$ of the PIC $58_3$ (represented in the schematic as OCNP3), and at least a portion of the offshoot trace OCNB3 on the rigid PCB 46; and the offshoot trace OCN6 includes the mid-section $68_{6OCN}$ and the compliant pin $72_{6OCN}$ of the PIC $58_6$ (represented in the schematic as OCNP6), and at least a portion of the offshoot trace OCNB6 on the rigid PCB 46. Capacitor CB36 is provided on the rigid PCB 46 between the offshoot traces OCNB3 and OCNB6, effectively shunting the 3:6 wire-pair and enabling the OCN component of the overall compensation scheme.

To be more specific, the OCN component of the presently described embodiment achieves the desired coupling between wire-pair 4:5 and wire-pair 3:6 through capacitive couplings C35 and C46, and inductive couplings MOCN35 and MOCN46. Signal trace S5 and the offshoot trace OCN3, in combination with the shunt capacitance CB36, interact capacitively to create the capacitive coupling C35 and interact inductively to create mutual inductive coupling MOCN35. Since both S5 and OCN3 traces span across multiple internal components, capacitive coupling C35 is a combination of capacitive coupling CP35 (caused by the capacitive interaction of mid-section $68_{3OCN}$ and compliant pin $72_{3OCN}$ with the mid-section $68_5$ and compliant pin $72_5$ in the back nose section of the PICs) and capacitive coupling CB35 (caused by the capacitive interaction of offshoot trace OCNB3 with the signal trace SB5 on the PCB). Similarly, since both S5 and OCN3 traces span across multiple internal components, inductive coupling MOCN35 is a combination of inductive coupling MOCNP35 (caused by the inductive interaction of mid-section $68_{3OCN}$ and compliant in $72_{3OCN}$ with the mid-section 68 and compliant pin $72_5$ the back nose section of the PICs) and inductive coupling MOCNB35 (caused by the inductive interaction of offshoot trace OCNB3 with the signal trace SB5 on the PCB).

Figure 16:
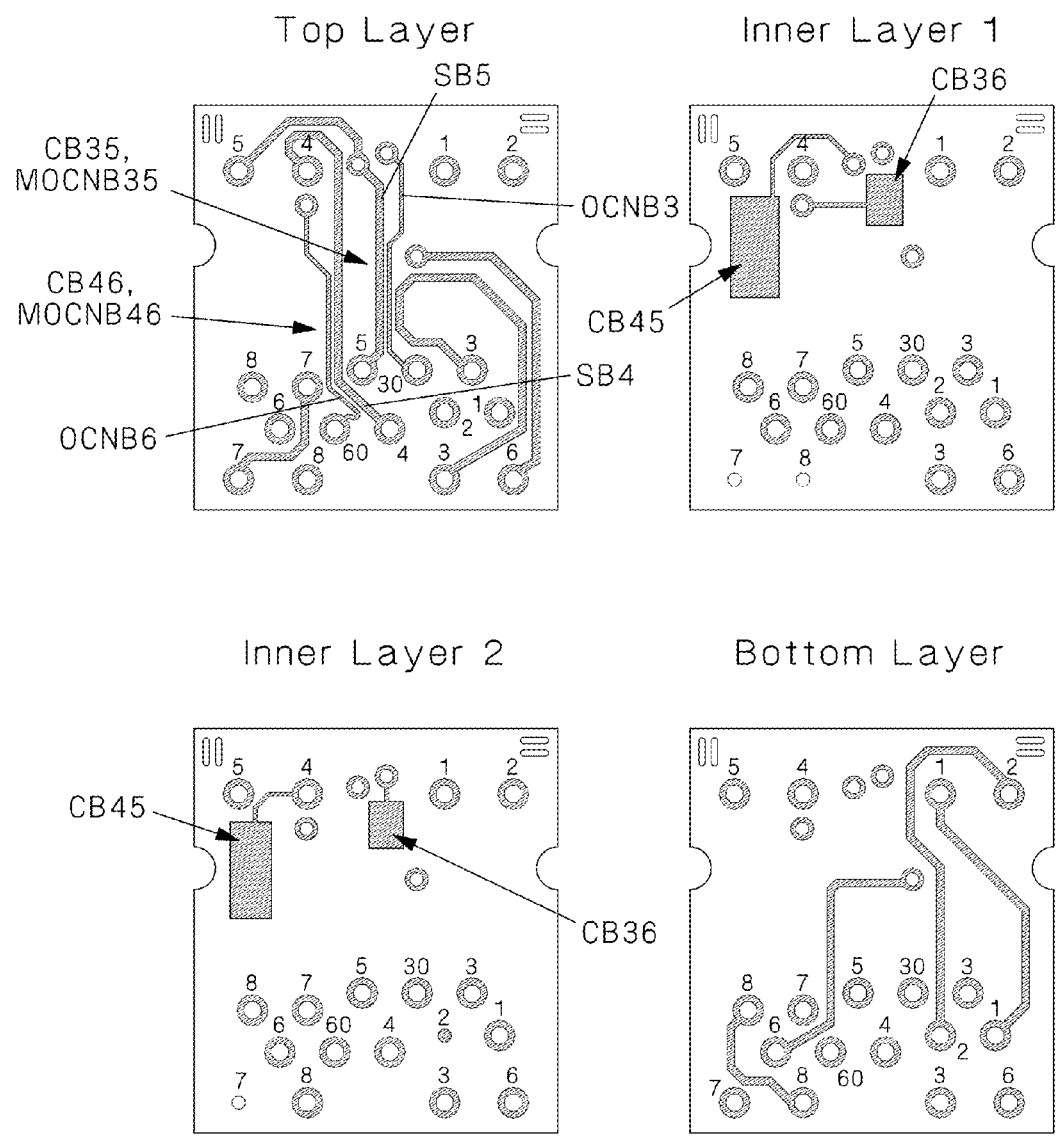
FIG. 16 illustrates the printed circuit board artwork for the rigid circuit board of FIG. 15.
Figure 17:
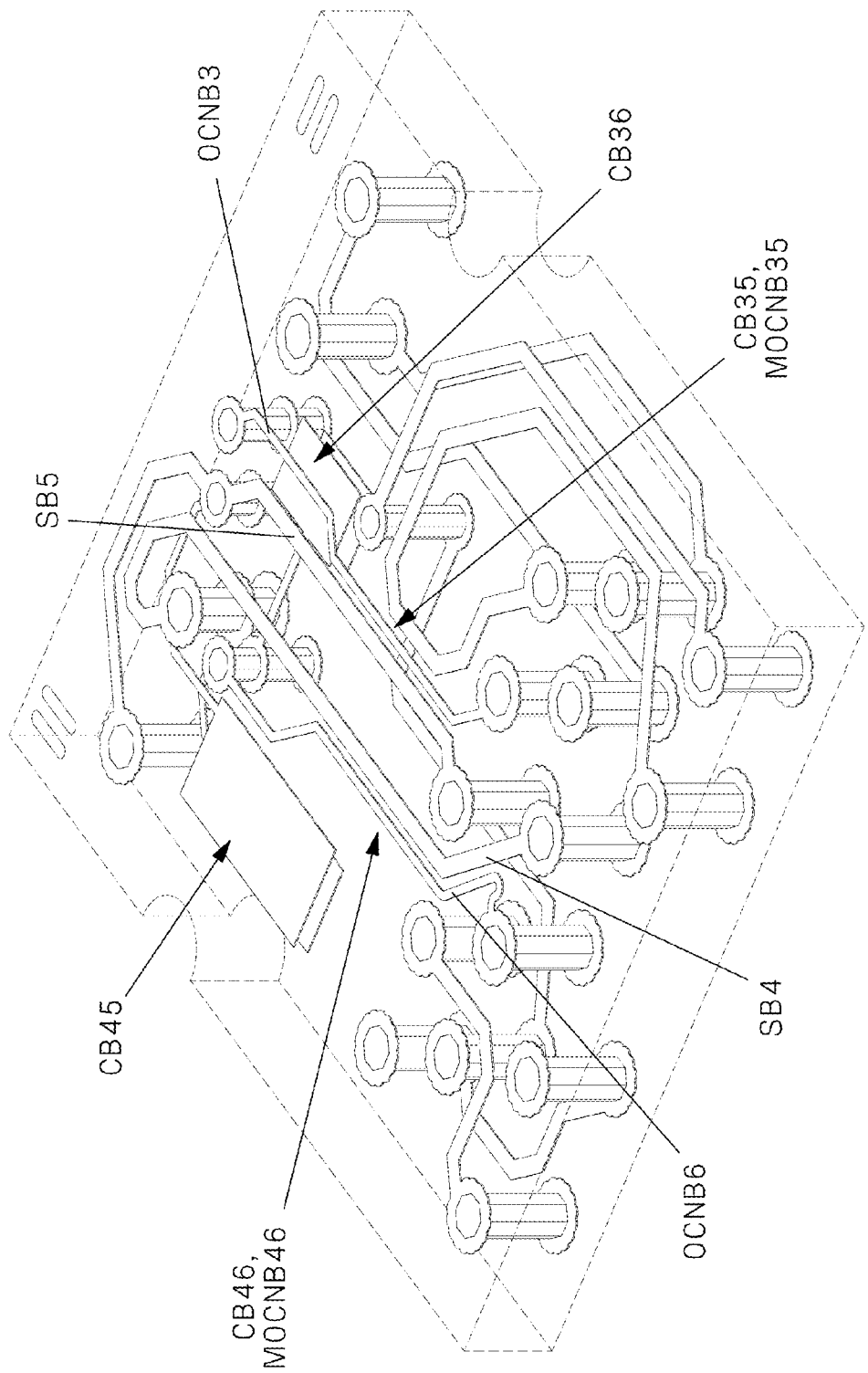
FIG. 17 illustrates an isometric view of the rigid circuit board of FIG. 15.

Likewise, signal trace S4 and the offshoot trace OCN6, in combination with the shunt capacitance CB36, interact capacitively to create the capacitive coupling C46 and interact inductively to create mutual inductive coupling MOCN46. Since both S4 and OCN6 traces span across multiple internal components, capacitive coupling C46 is a combination of capacitive coupling CP46 (caused by the capacitive interaction of mid-section $68_{6OCN}$ and compliant pin $72_{6OCN}$ with the mid-section $68_4$ and compliant pin $72_4$ in the back nose section of the PICs) and capacitive coupling CB46 (caused by the capacitive interaction of offshoot trace OCNB6 with the signal trace SB4 on the PCB). Similarly, since both S4 and OCN6 traces span across multiple internal components, inductive coupling MOCN46 is a combination of inductive coupling MOCNP46 (caused by the inductive interaction of mid-section $68_{6OCN}$ and compliant Pin $72_{6OCN}$ with the mid-section $68_4$ and compliant pin $72_4$ in the back nose section of the PICs) and inductive coupling MOCNB46 (caused by the inductive interaction of offshoot trace OCNB6 with the signal trace SB4 on the PCB). An example of the PCB artwork employed to achieve the above-described couplings is shown in FIGS. 16 and 17.

The inductive couplings MOCN46 and MOCN35 are created by the jack components, and thus occur in generally the same physical locations, as capacitive couplings C46 and C35, respectively. Because the OCN component of the currently described embodiment generally provides coupling between traces 3 and 5, and 4 and 6, the net resultant signal produced by this network would typically be considered a compensation signal. The net resultant compensation signal of couplings CF35, CF46, C35, C46, MOCN35, MOCN46, and CB36 provides additional NEXT bandwidth which may help to allow wire-pair combination 4:5-3:6 to meet standards for Category 6A and/or beyond.

In an alternate embodiment the OCN component may be implemented to provide a net resultant signal which would typically be considered a crosstalk signal.

Figure 18:
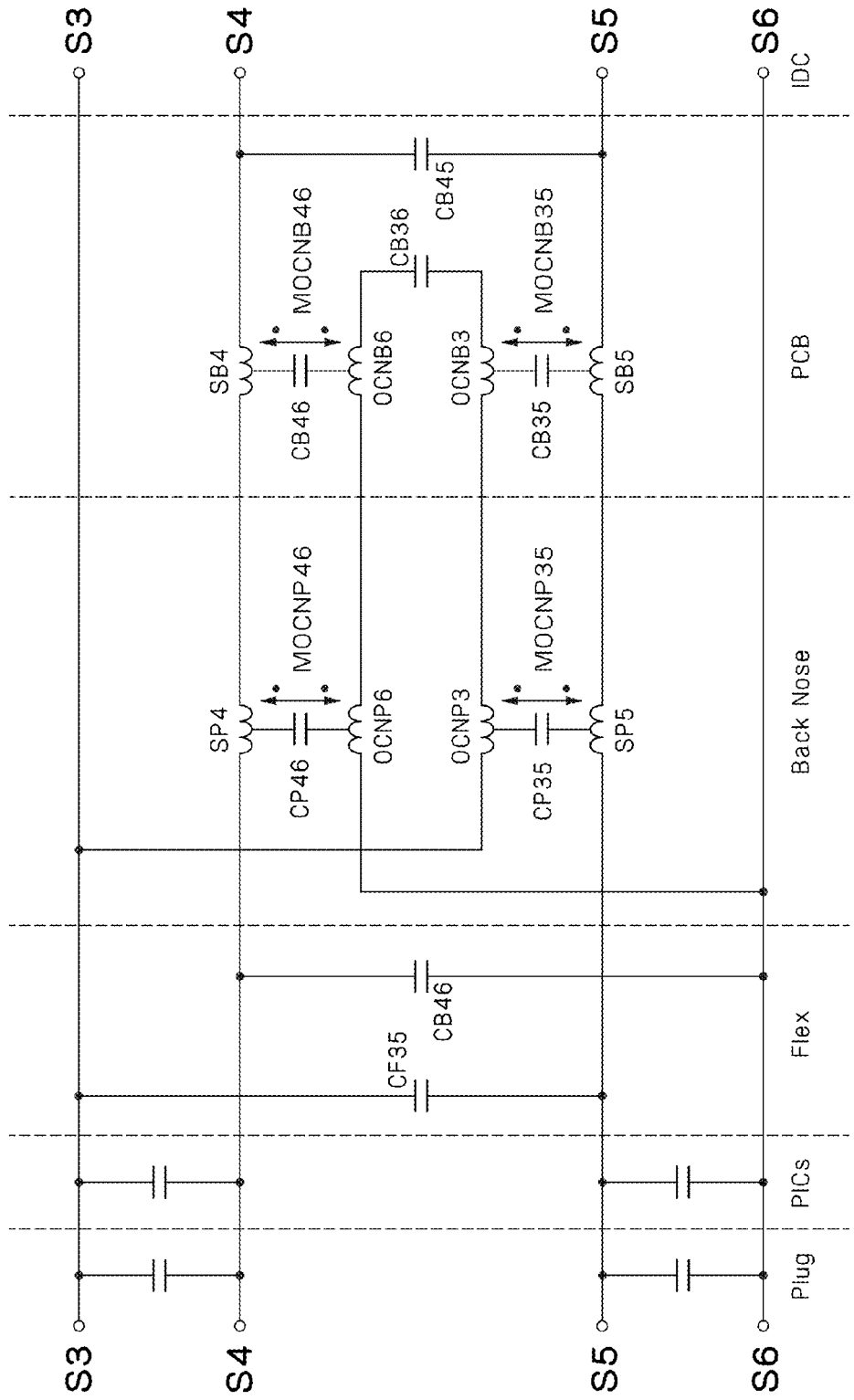
FIG. 18 illustrates a schematic representation of a plug mated with a jack designed in accordance with an embodiment of the present invention.
Figure 19:
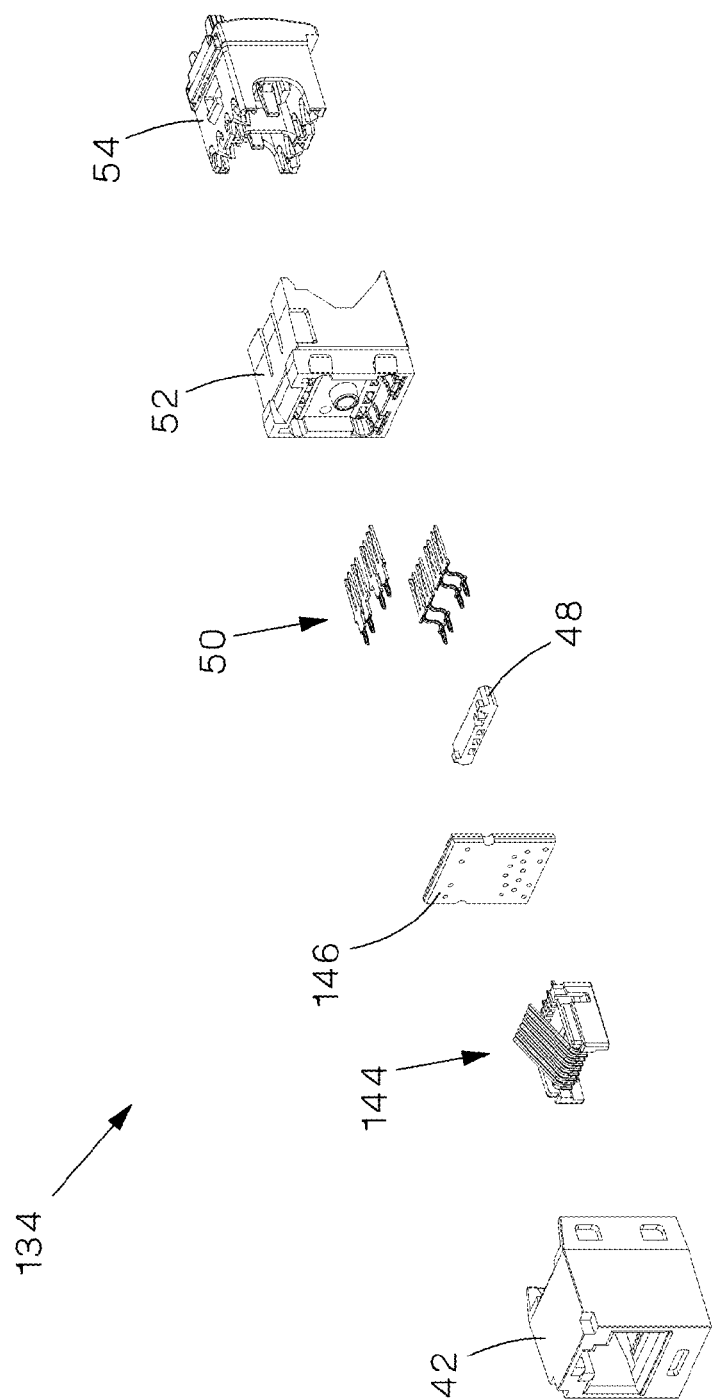
FIG. 19 illustrates an exploded view of another communication jack according to an embodiment of the present invention.

FIG. 18 schematically illustrates the above-described compensation scheme embodiment implemented in a mated plug/jack combination in accordance with an embodiment of the present invention. Note that only components related to the 4:5-3:6 wire pair combination are shown in the figure. The plug/jack combination of FIG. 18 is separated into five sections: Plug, PICs, Flex, Back Nose, and PCB. The Plug and the PICs, sections illustrate the crosstalk coupling inherently present in the plug and at the mating point of the plug/jack combination. The Flex section illustrates the coupling provided between conductors 3 and 5, and 4 and 6, respectively, by pad capacitors CF35 and CF46 on the flexible circuit board 59. In an embodiment the CF35 capacitor is approximately 0.13 pF+/−20% and the CF46 capacitor is approximately 0.12 pF+/−20%.

The Back Nose section illustrates the coupling which occurs along the mid-sections 68 and compliant pins 72 of the PICs 58 (creating a portion of the overall coupling provided by the OCN components of the presently described embodiment). Mid-sections and compliant pins $68_{OCN3}/72_{OCN3}$ (corresponding to OCNP3) and $68_5/72_3$ (corresponding to SP5), and $68_4/72_4$ (corresponding to SP4) and $68_{OCN6}/72_{OCN6}$ (corresponding to OCNP6), generate respective capacitive couplings CP35 and CP46. In an embodiment each of capacitive couplings CP35 and CP46 is approximately 0.25 pF±/−20%. OCNP3 and SP5, and SP4 and OCNP6 further act as inductors and have inductive values. In one embodiment these values are approximately 4.1 nH+/−20%, approximately 4.0 nH+/−20%, approximately 3.81 nH+/−20%, and 3.88 nH+/−20%, respectively.

Lastly, the PCB section illustrates the coupling which occurs on the rigid PCB 46 (creating the remaining portion of the overall coupling provided by the OCN components of the presently described embodiment). Signal traces SB5 and offshoot trace OCNB3 generate capacitive coupling CB35, and signal traces SB4 and offshoot trace OCNB6 generate capacitive coupling CB46. In an embodiment, CB35 is approximately 0.405 pF+/−20% and CB46 is approximately 0.137 pF+/−20%. Signal traces SB4 and SB5, and offshoot traces OCNB3 and OCNB6 further act as inductors and have inductive values. In one embodiment these values are approximately 10.1 nH+/−20%, approximately 10.1 nH+/−20%, approximately 9.1 nH+/−20%, and 7.1 nH+/−20%, respectively, A shunting capacitance CB36 is also positioned on the PCB, enabling the entire OCN component (which spans the Split Contacts and the PCB sections). In an embodiment, CB36 is approximately 1.06 pF+/−20%.

Given the exemplary values listed herein, when the entire OCN is enabled, mutual inductive coupling MOCN46 (approximately 5.5 nH+/−20%) between SP4 and SB4, and OCNP6 and OCNB6, and mutual inductive coupling MOCN35 (approximately 6.5 nH+/−20%) between SP5 and SB5, and OCNP3 and OCNB3 is created. MOCN46 and MOCN35 are created at the same physical locations as CP46 and 0346, and CP35 and CB35, respectively. Additionally, signals produced by MOCN46 and MOCN35 are orthogonal to the coupling created by CP46 and CB46, and CP35 and CB35.

The phase of the orthogonal component (created by MOCN35 and MOCN46, in combination with the shunting capacitance CB36) can have a dependency on the load impedance. Higher load impedances cause the phase angle between the orthogonal compensating vector and the non-orthogonal compensating vector (created by the capacitive couplings C35 and C46) to be less than 90 degrees. The IDCs can create an area of high impedance which may have this detrimental effect (loss of orthogonallity), causing the NEXT bandwidth to be less than desired. Thus, in some embodiments of the present invention, a shunting capacitance CB45 (2.75 pF+/−20%) (e.g., a pad capacitor) may be provided on the rigid circuit board 46. This capacitance may be connected to the signal traces SB4 and SB5 near or at the IDC vias of the respective contacts. It can be used to help lower the impedance of the IDCs, improving the orthogonallity in the orthogonal compensation network between wire-pairs 4:5 and 3:6.

In another embodiment of the present invention shown in FIGS. 19-28, network jack 134 employs an OCN which uses sections of the PICs and a flexible PCB to generate the desired OCN signal. The jack 134 includes a front housing 42, a front sled subassembly 144, a PCB 146, an IDC support 48, IDCs 50, a rear housing 52, and a wire cap 54. The IDCs 50, rear housing 52, wire cap 54, and front sled subassembly 144 (except for the flex board) are as described in U.S. Patent Application Publication No. 2014/0011393 (Straka et al.), entitled "Communication Connector with Crosstalk Compensation," filed on May 30, 2013, incorporated herein by reference in its entirety. The jack 134 can additionally include an alien crosstalk reducing foil as described in U.S. Pat. No. 8,632,362 (Straka et al.) entitled "Method And System For Improving Crosstalk Attenuation Within A Plug/Jack Connection And Between Nearby Plug/Jack Combinations," filed on Mar. 28, 2012, and incorporated herein by reference in its entirety.

Figure 20:
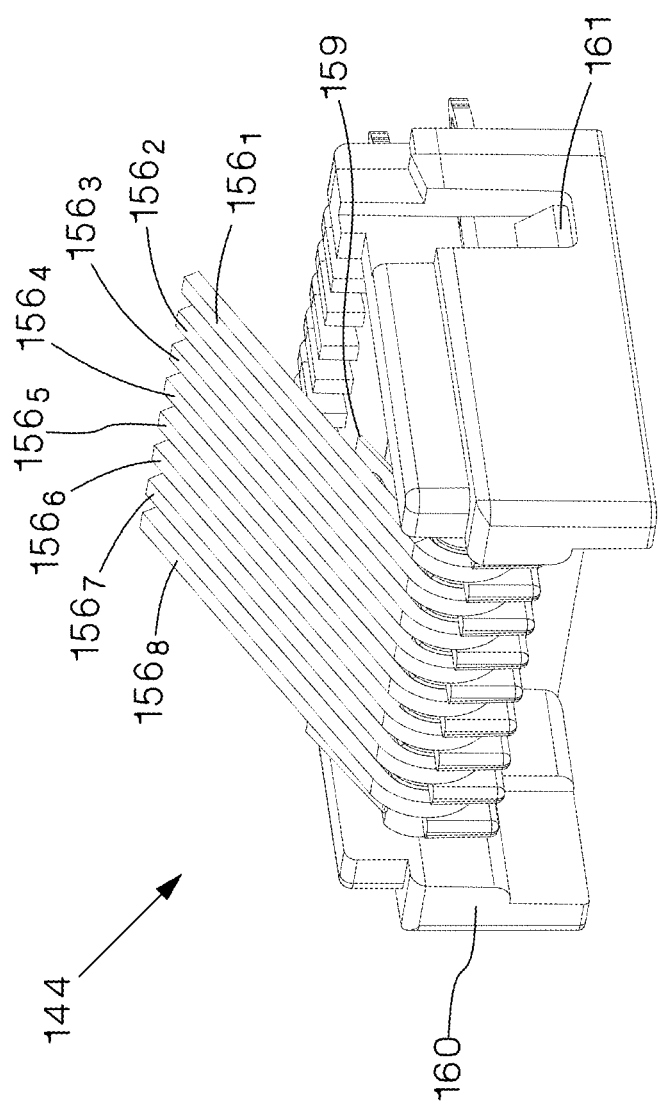
FIG. 20 illustrates a front isometric view of an embodiment of the front sled subassembly of FIG. 19.
Figure 21:
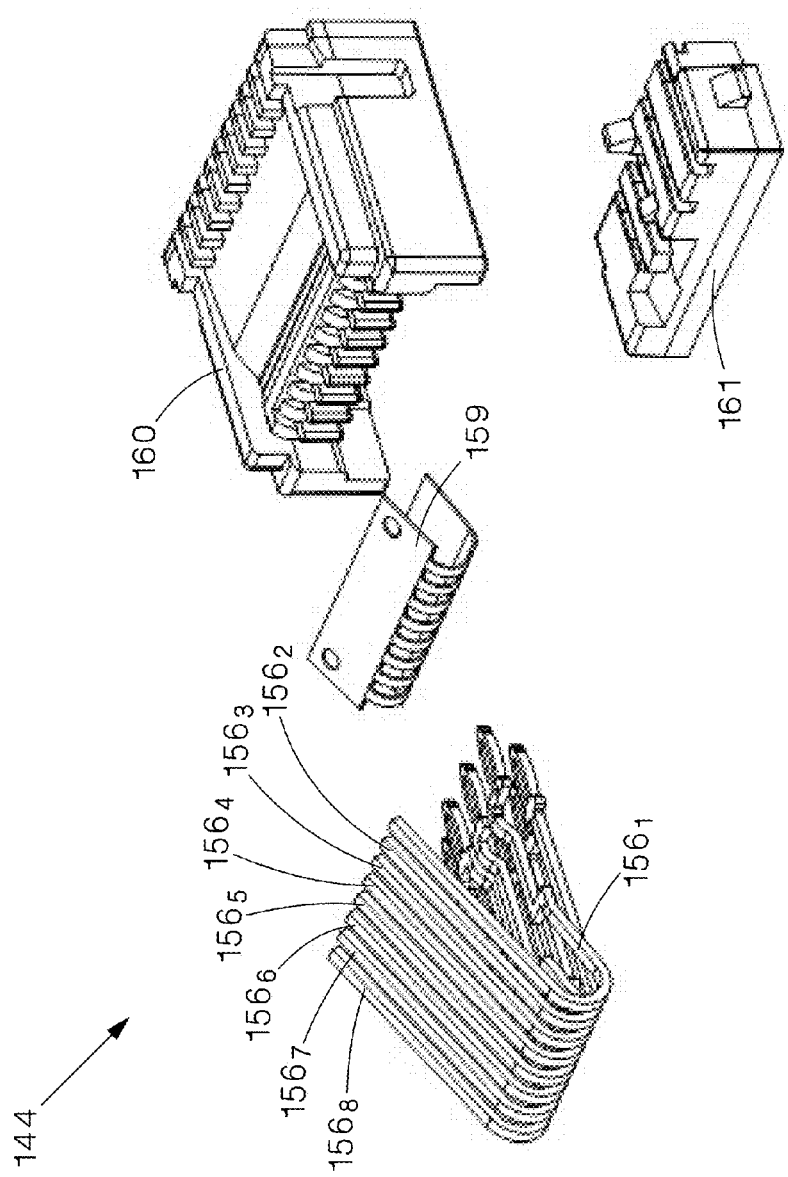
FIG. 21 illustrates an exploded view of the front sled subassembly of FIG. 20.
Figure 22:
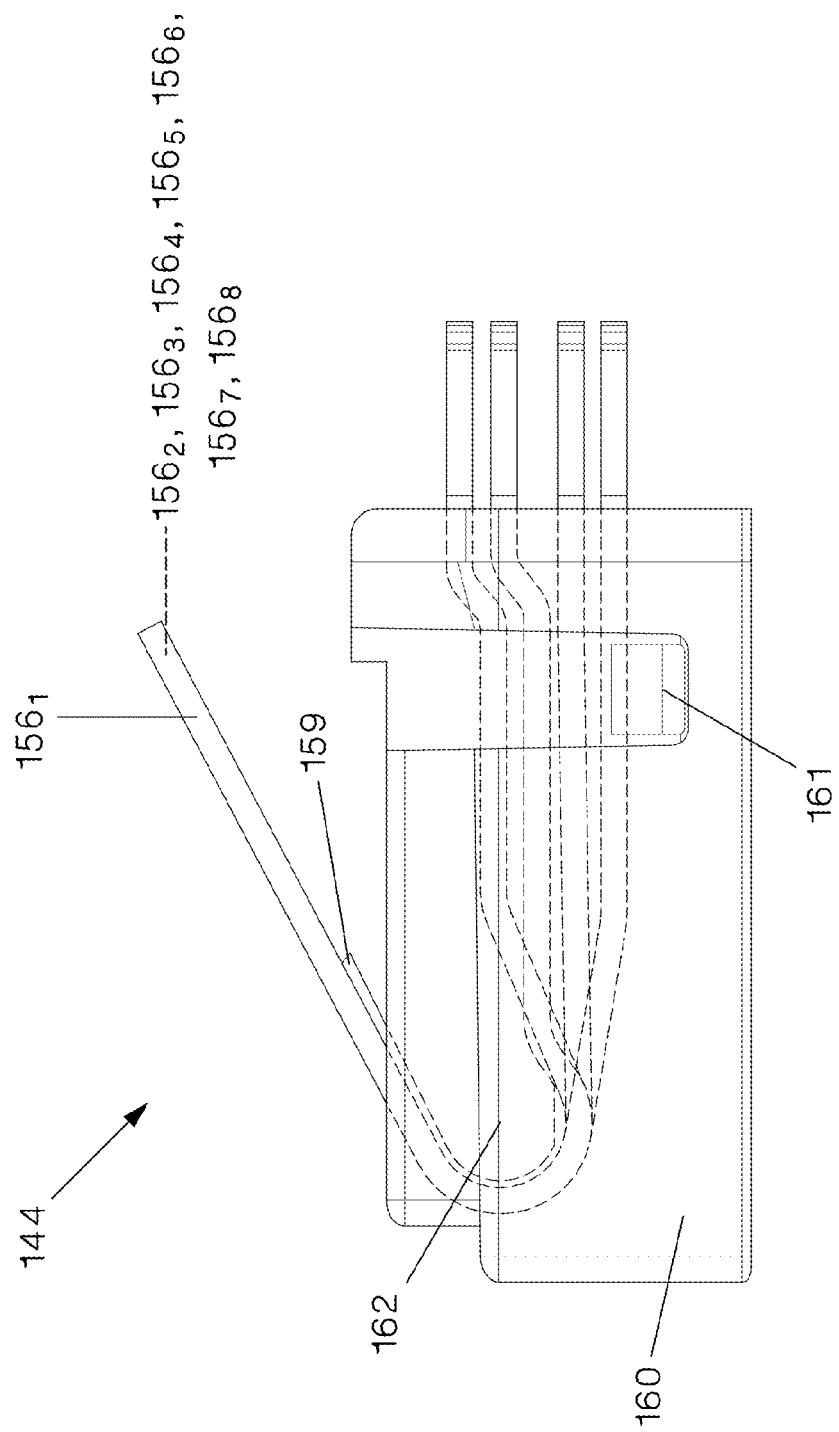
FIG. 22 illustrates a side view of the front sled subassembly of FIG. 20.

As shown in greater detail in FIGS. 20-22, the front sled subassembly 144 includes PICs 156, a flexible PCB 159, a top sled 160, and a bottom sled 161. The subscript numbers of each PIC 156 represent RJ45 pin positions as defined by ANSI/TIA-568-C.2. PICs 156 are wrapped around inner mandrel 162 during the assembly process. This secures the flexible circuit board 159 in the same manner as the RJ45 jack described in the Straka et al. '393 publication. As a result of the positioning of the flexible PCB 159, at least some elements on the flexible PCB 159 can interact in a distributed manner with the signal conductors (i.e., the PICs), allowing for an OCN to be implemented on at least some signal pairs in a region that is a relatively short distance away from the offending plug/jack crosstalk.

Figure 23:
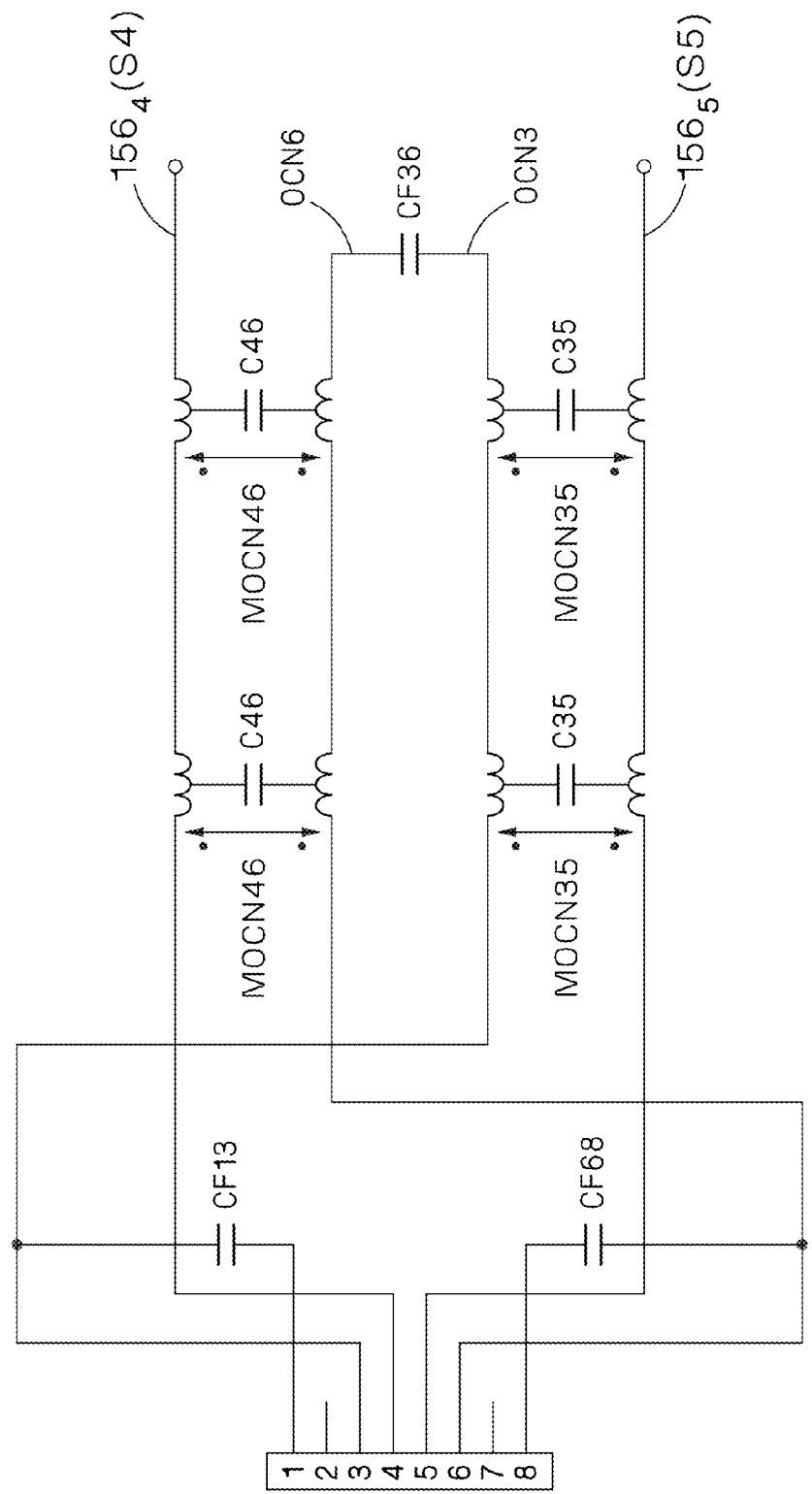
FIG. 23 illustrates a schematic view of an embodiment of the flex circuit board used in the front sled subassembly of FIG. 20.
Figure 24:
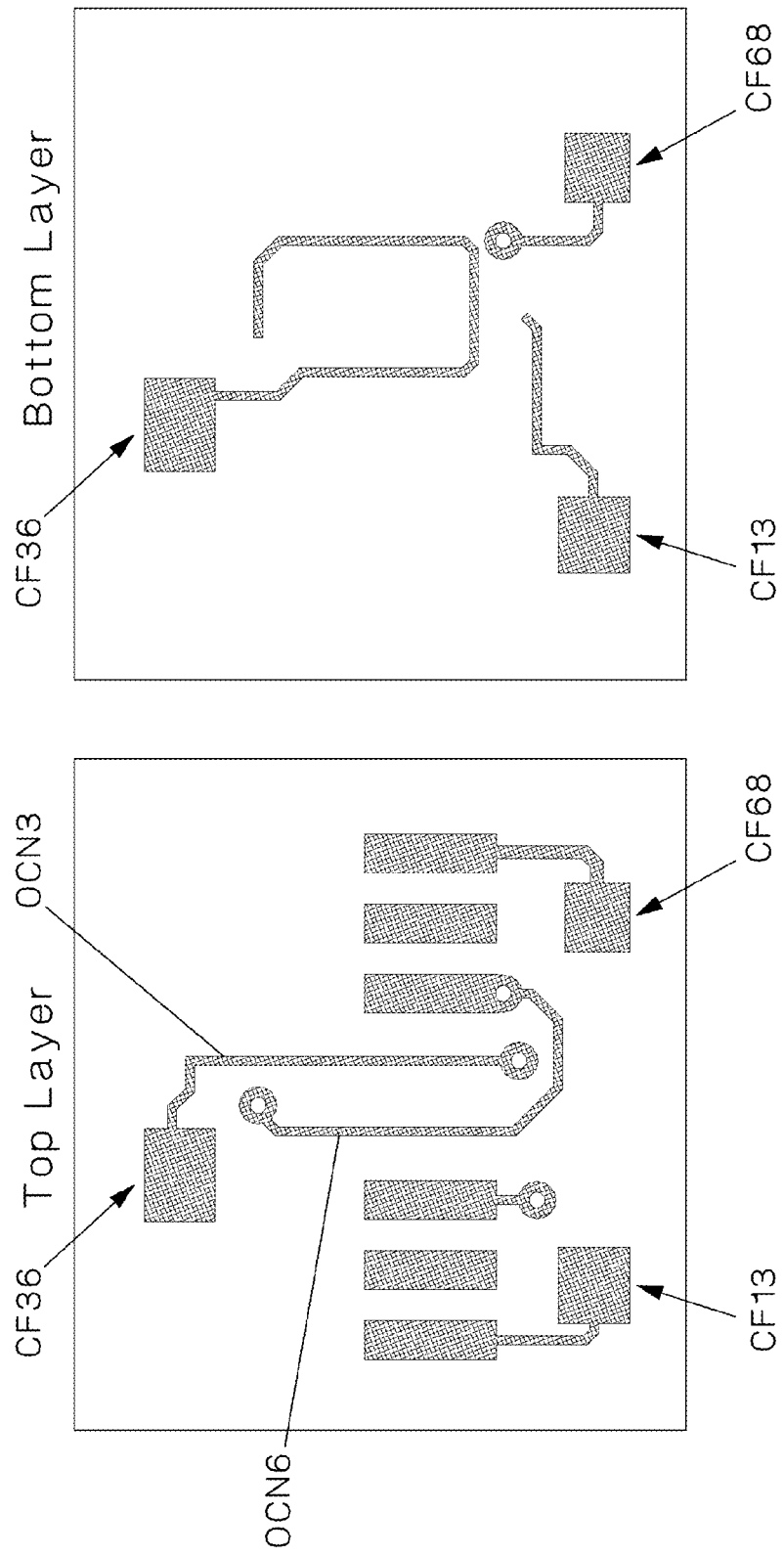
FIG. 24 illustrates the printed circuit board artwork for the flex circuit board of FIG. 23.
Figure 25:
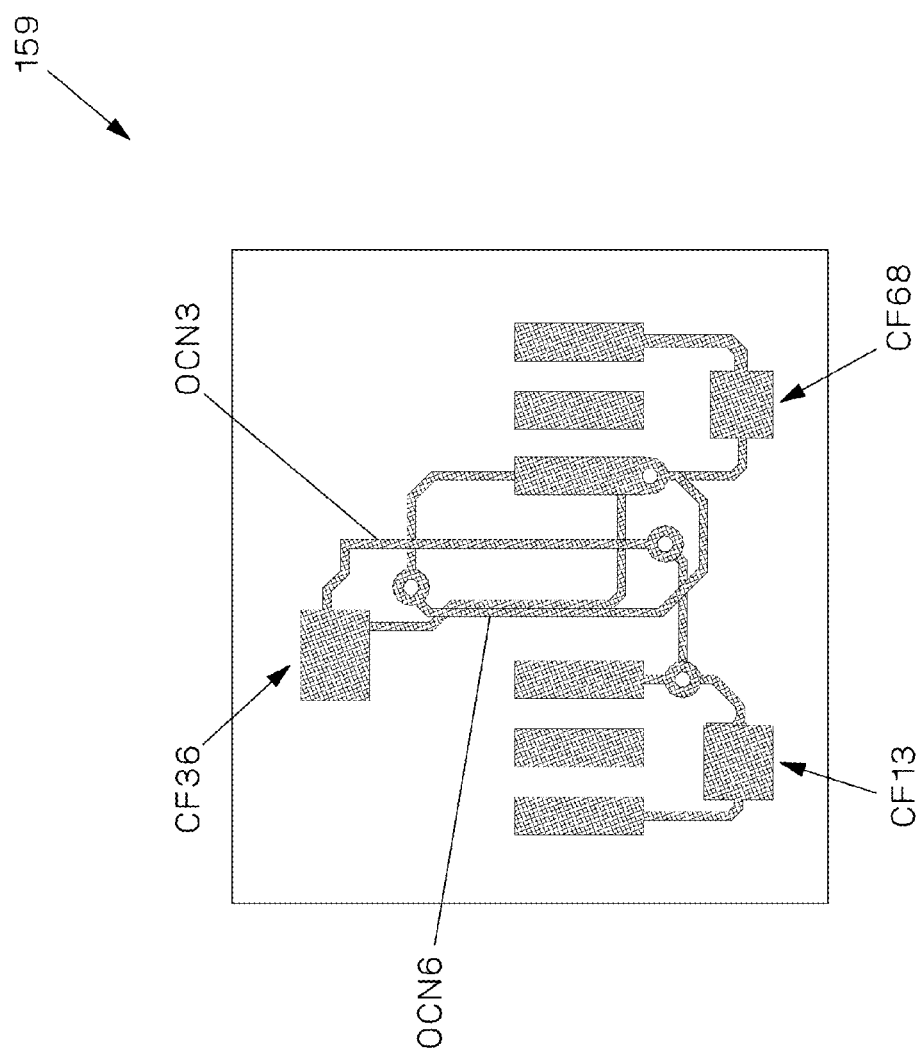
FIG. 25 illustrates top view of the flex circuit board of FIG. 23.

A schematic representation of the compensation scheme implemented between the flexible PCB 159 and the PICs 156 is shown in FIG. 23, and the corresponding artwork for the flexible PCB 159 is shown in FIGS. 24 and 25.

The OCN of the currently described embodiment uses PICs $156_4$ and $156_5$ as signal traces S4 and S5, offshoot traces OCN3 and OCN6 positioned on the flexible PCB 159, and capacitor CF36 positioned on the flexible PCB 159 to create the desired signal. To be more specific, the OCN component of the presently described embodiment achieves the desired coupling between wire-pair 4:5 and wire-pair 3:6 through capacitive couplings C35 and C46, and inductive couplings MOCN35 and MOCN46. Signal trace S5 and the offshoot trace OCN3, in combination with the shunt capacitance CF36, interact capacitively to create the capacitive coupling C35 and interact inductively to create mutual inductive coupling MOCN35. Likewise, signal trace S4 and the offshoot trace OCN6, in combination with the shunt capacitance CF36, interact capacitively to create the capacitive coupling C46 and interact inductively to create mutual inductive coupling MOCN46.

The inductive couplings MOCN46 and MOCN35 are created by the jack components, and thus occur in generally the same physical locations, as capacitive couplings C46 and C35, respectively. Consequently, these couplings occur concurrently. Because the OCN component of the currently described embodiment generally provides coupling between traces 3 and 5, and 4 and 6, the net resultant signal produced by this network would typically be considered a compensation signal. The net resultant compensation signal of couplings C35, C46, MOCN35, MOCN46, and CF36 provides additional NEXT bandwidth which may help to allow wire-pair combination 4:5-3:6 to meet standards for Category 6A and/or beyond.

While the implementation of an OCN which utilizes the PICs and the flexible PCB has been shown with reference to the 3:6-4:5 signal pair combination, those of ordinary skill will understand that the same techniques can be expanded to be used on any signal pair combination within a communication connector such as a jack.

In addition to the OCN, the flexible PCB 159 includes capacitive coupling CF13 and CF68, achieved in this case via pad capacitors. CF13 provides simple compensation between conductors 1 and 3 of the 1:2-3:6 wire pair combination, and CF68 provides simple compensation between conductors 6 and 8 of the 3:6-7:8 wire pair combination. In both cases, the signals produced by these couplings would typically be considered compensation signals.

Since PICs $156_3$, $156_4$, $156_5$, $156_6$, act as self inductors in the back nose section, their proximity to each other also produces mutually inductive coupling M35 between PICs $156_3$ and $156_5$, and mutually inductive coupling M46 between PICs $156_4$ and $156_6$. This could be advantageous for obtaining desired far end crosstalk (FEXT) performance.

Figure 26:
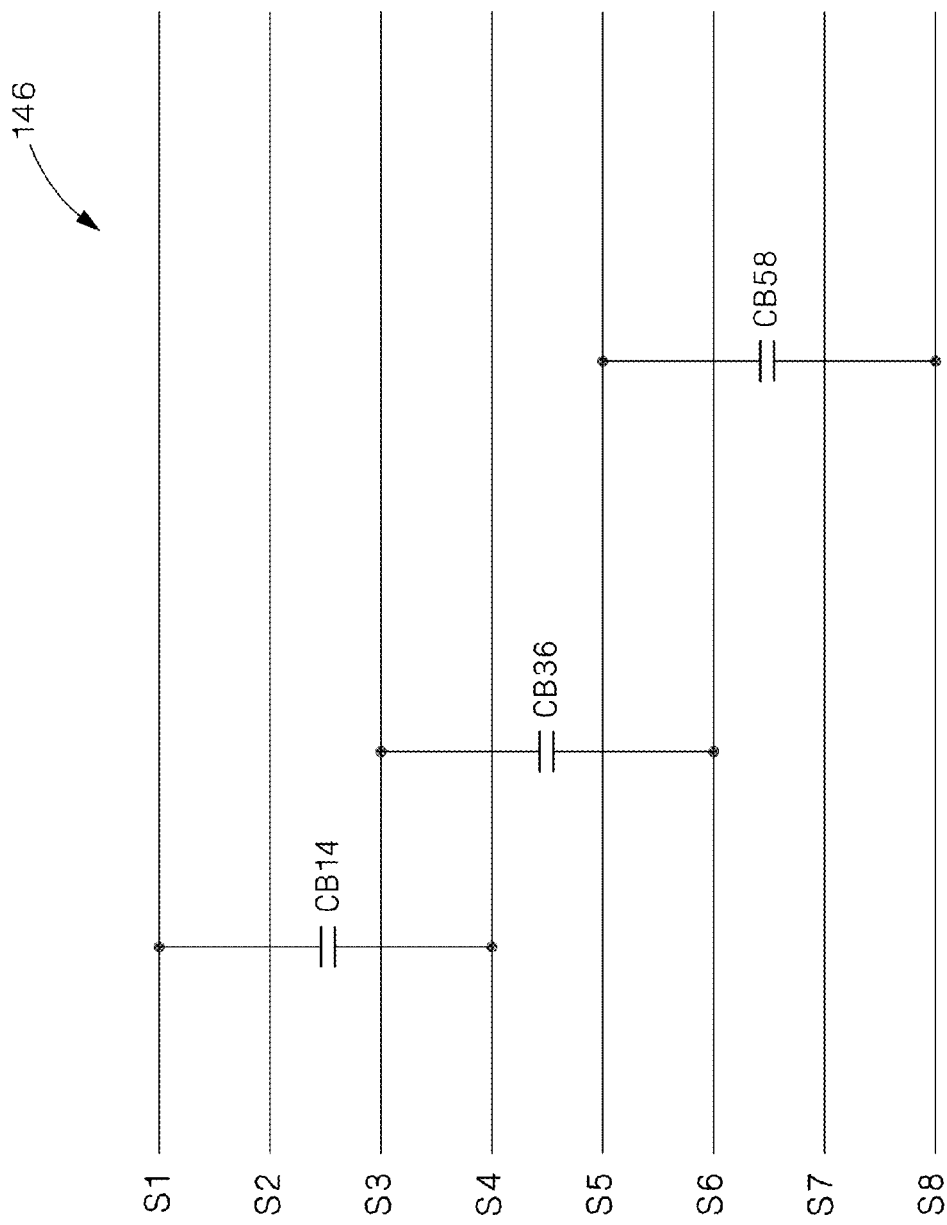
FIG. 26 illustrates a schematic view of an embodiment of the rigid circuit board of the jack of FIG. 19.
Figure 27:
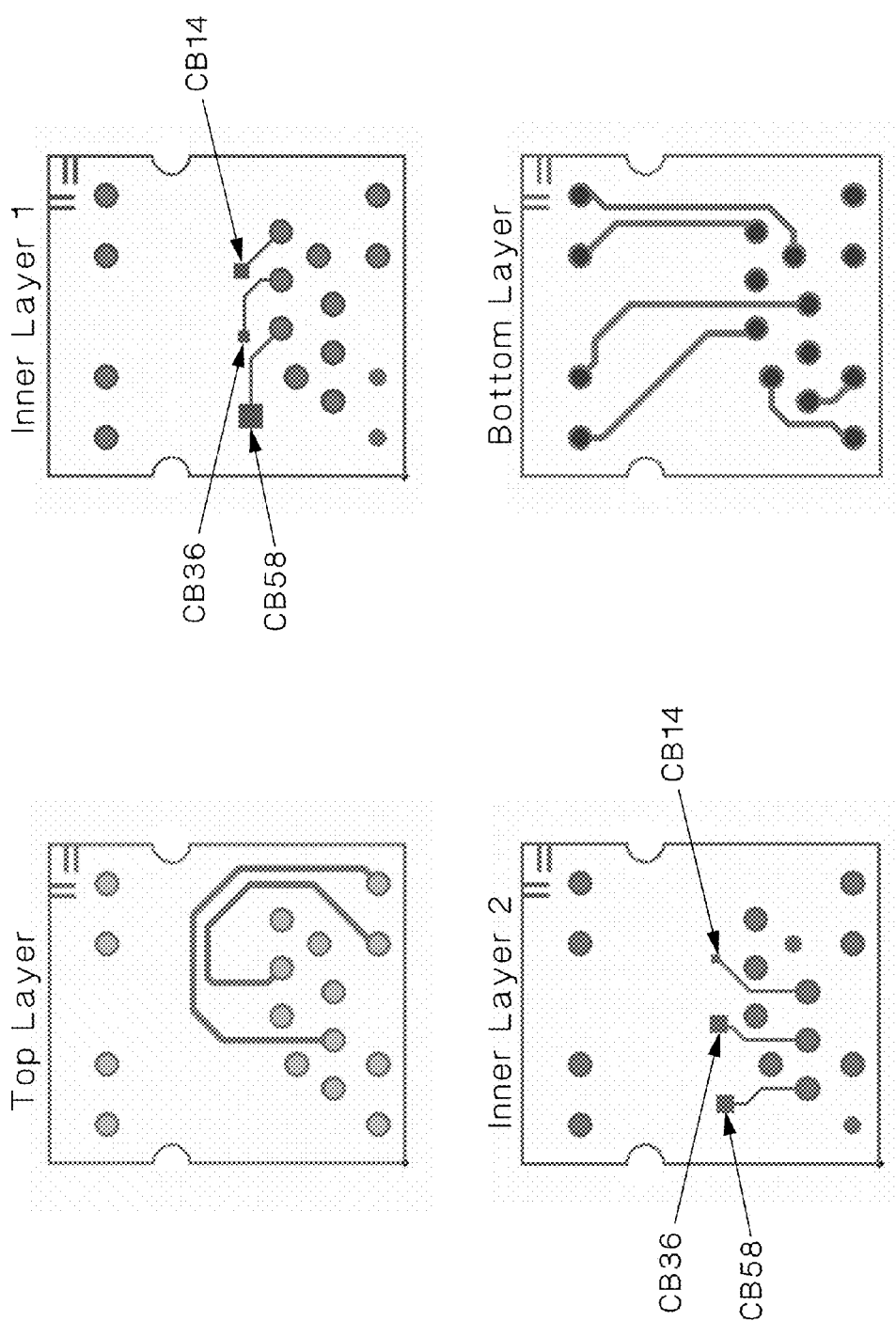
FIG. 27 illustrates the printed circuit board artwork for the rigid circuit board of FIG. 26.
Figure 28:
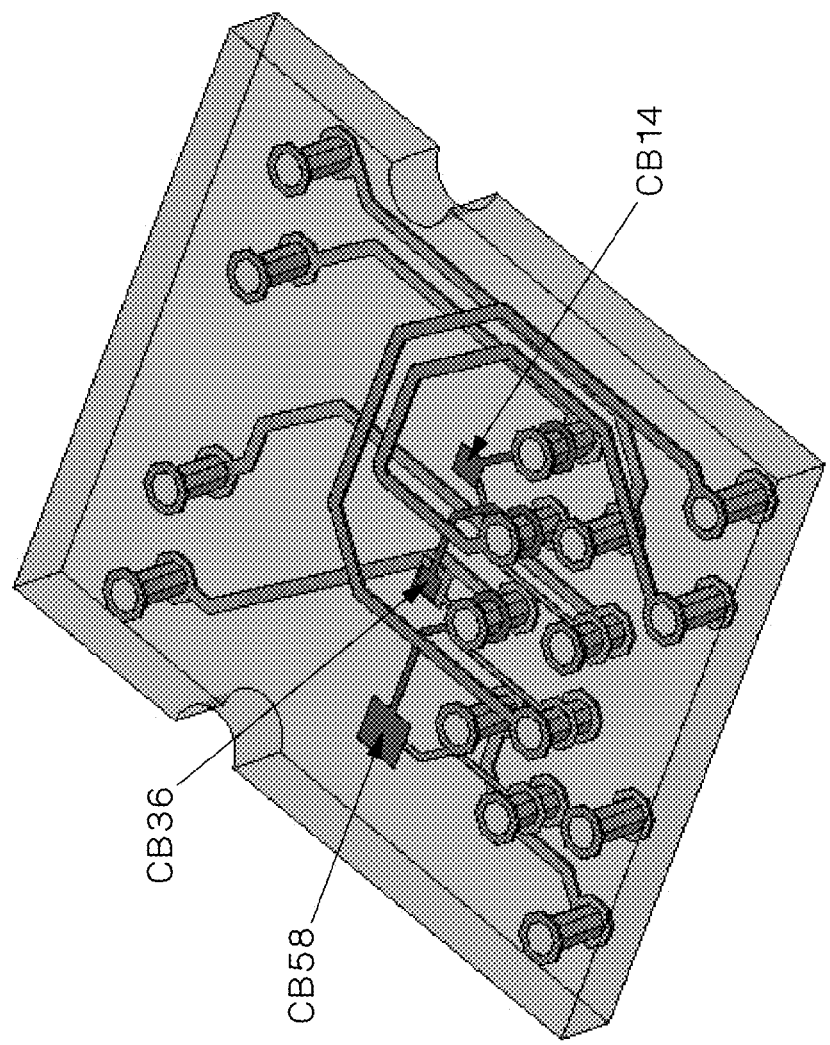
FIG. 28 illustrates an isometric view of the rigid circuit board of FIG. 27.

The nose subassembly 144 can be coupled with PCB 146, for which an exemplary schematic is shown in FIG. 26, and the corresponding artwork in FIGS. 27 and 28. PCB 146 implements simple compensation between the 1:2-4:5 wire pair combination by way of a capacitive coupling (e.g., a pad capacitor) CB14 positioned between signal traces S1 and S4. Likewise, PCB 146 implements simple compensation between the 4:5-7:8 wire pair combination by way of a capacitive coupling (e.g., a pad capacitor) CB58 positioned between signal traces S5 and S8. In addition, a capacitive coupling (e.g., a pad capacitor) CB36 between signal traces S3 and S6 is implemented to improve impedance matching.

Figure 29:
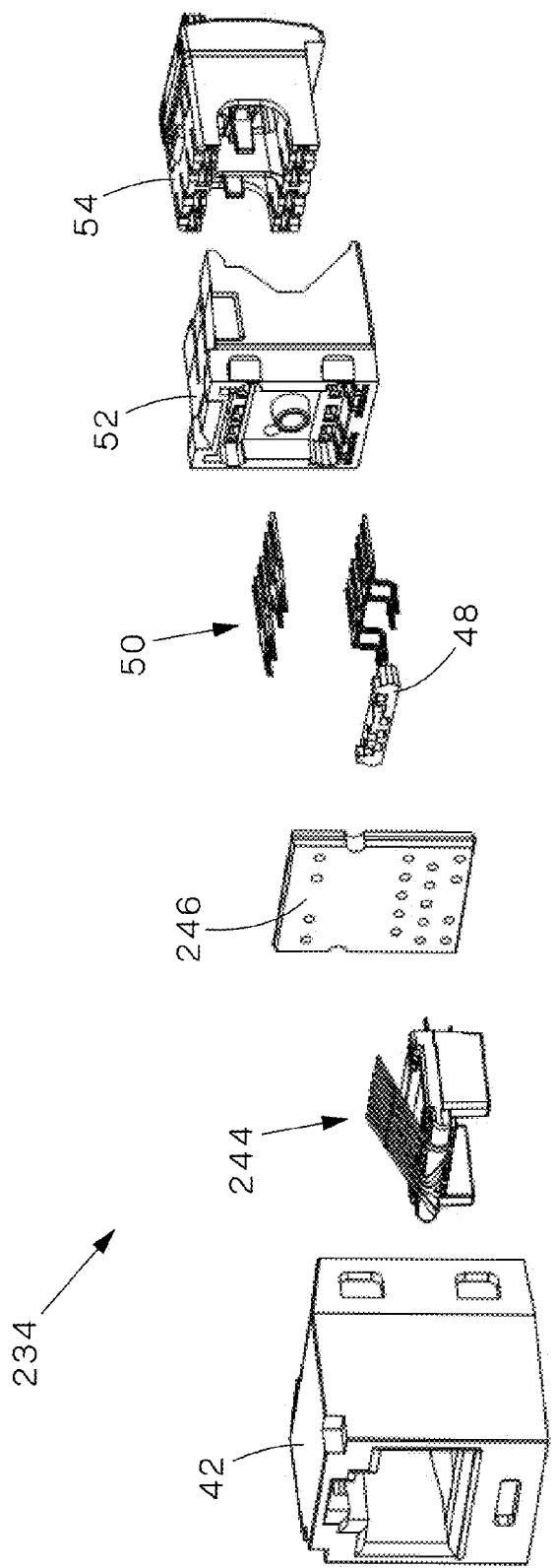
FIG. 29 illustrates an exploded view of another communication jack according to an embodiment of the present invention.

FIG. 29 illustrates an exploded view of another embodiment of a network jack 234, which includes a front housing 42, a front sled subassembly 244, a PCB 246, an IDC support 48, IDCs 50, a rear housing 52, and a wire cap 54. In alternate embodiments, jack 234 can additionally include alien crosstalk-reducing materials such as a foil.

Figure 30:
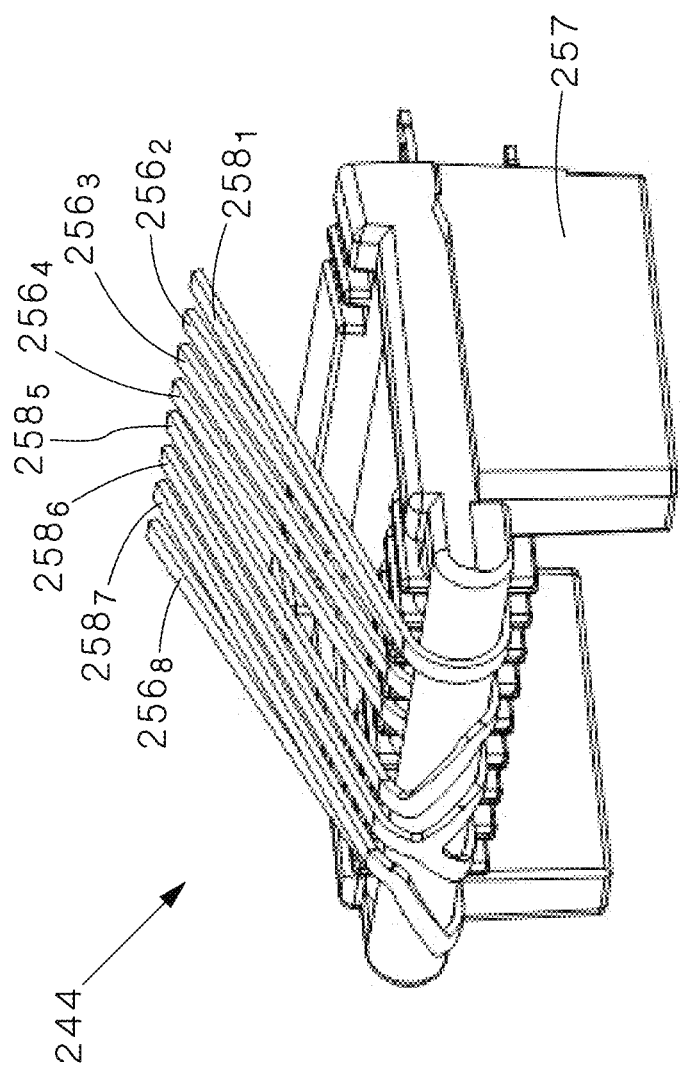
FIG. 30 illustrates a front isometric view of an embodiment of the front sled subassembly of FIG. 29.
Figure 31:
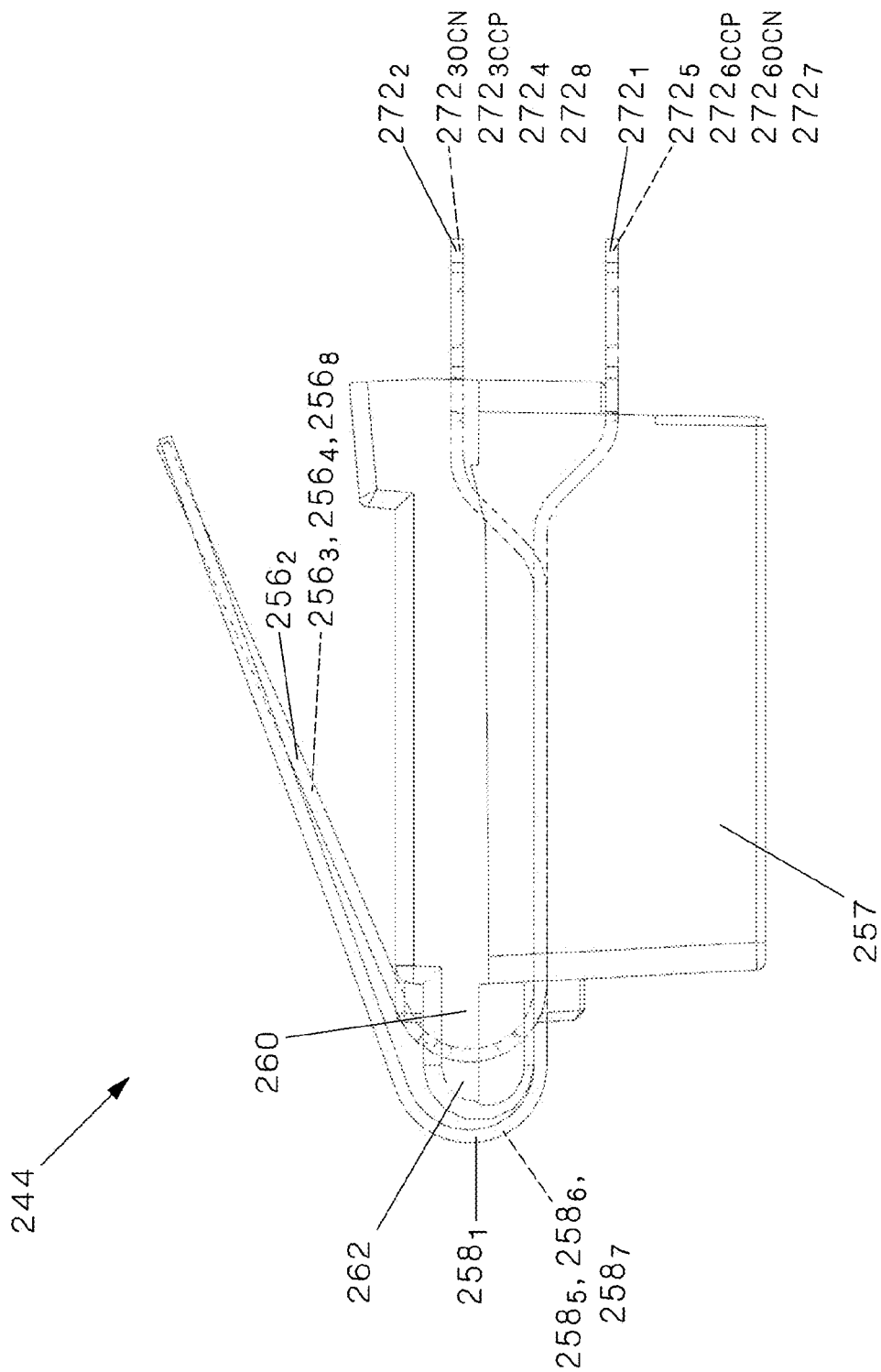
FIG. 31 illustrates a side view of the front sled subassembly of FIG. 30.
Figure 32:
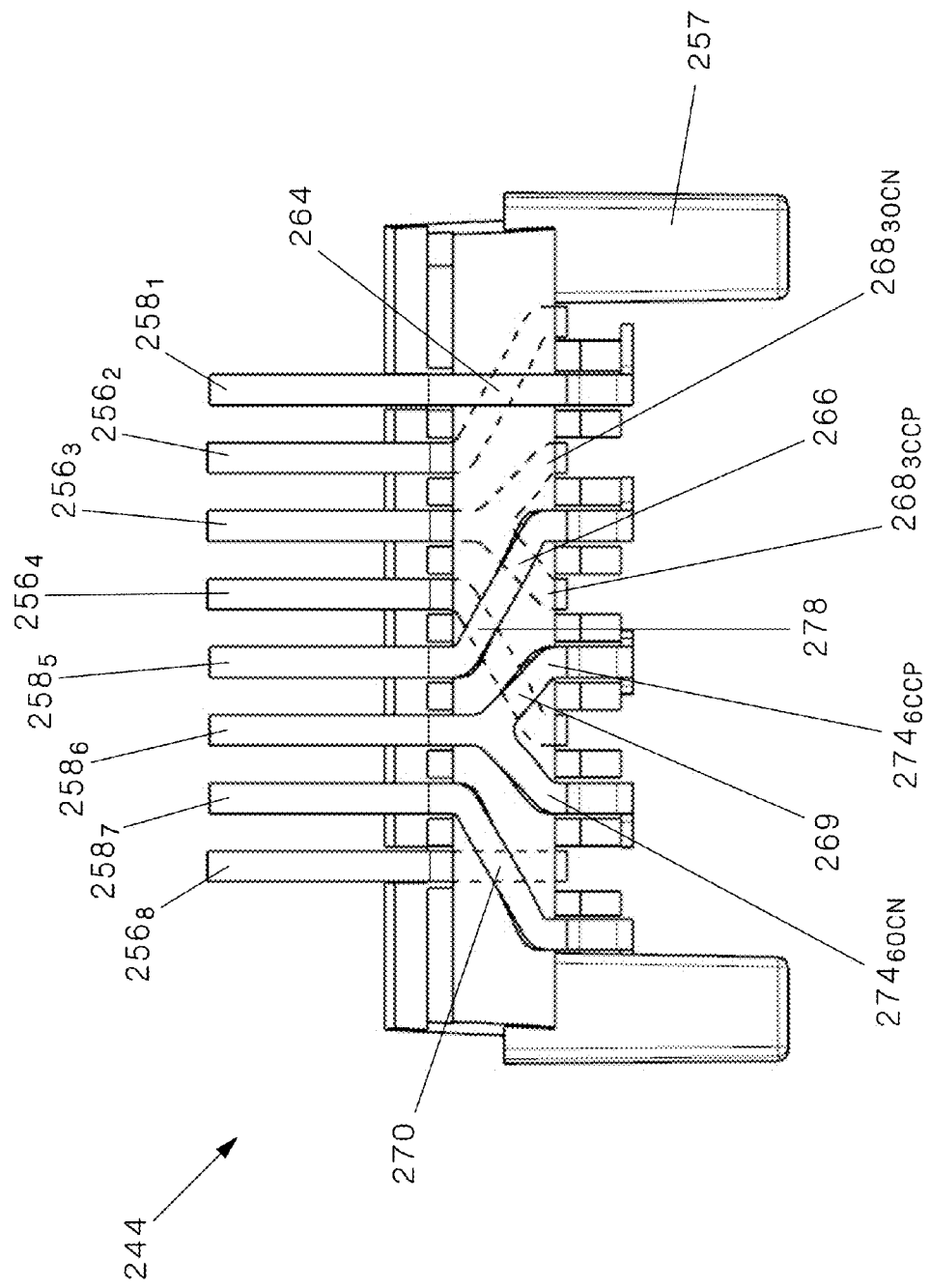
FIG. 32 illustrates a front view of the front sled subassembly of FIG. 30.

The front sled subassembly 244 is shown in greater detail in FIGS. 30-32. It includes PICs 256 and 258, and a sled 257. The subscript numbers for each PIC 256 and 258 correspond to the RJ45 pin positions as defined by ANSI/TIA-568-C.2. As shown in FIG. 31, each PIC 256 is wrapped around an inner mandrel 260 and each PIC 258 is wrapped around an outer mandrel 262. This can be performed during the assembly of the front sled subassembly 244.

Figure 33:
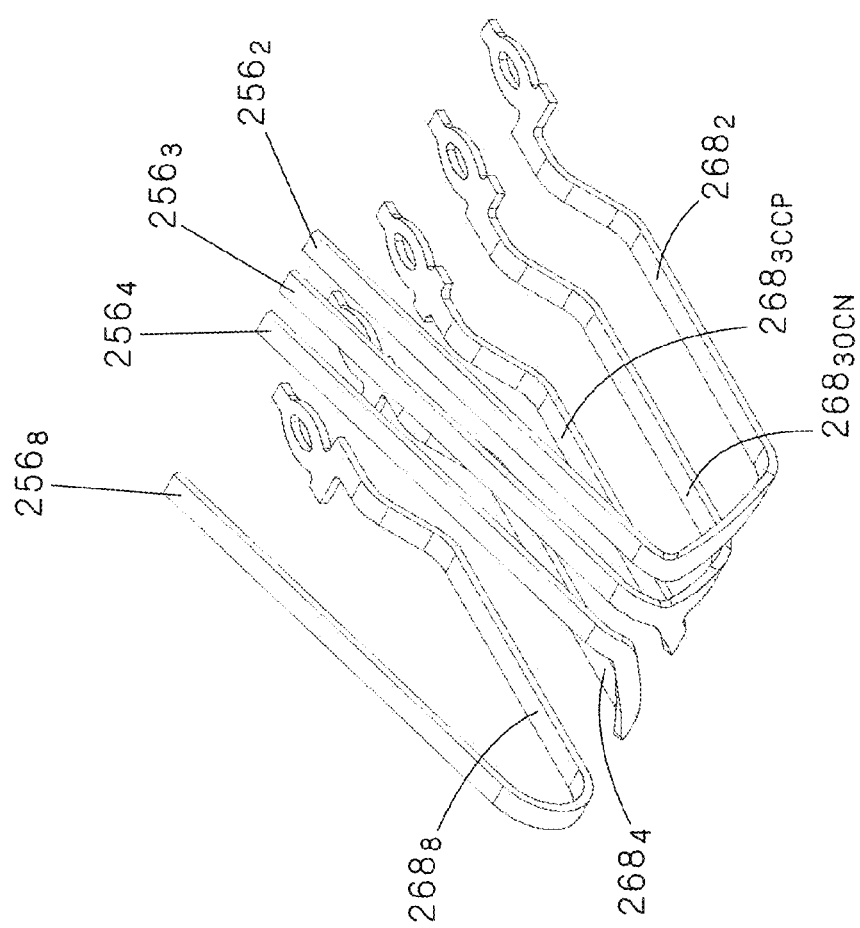
FIG. 33 illustrates an isometric view of PICs 2, 4 and 8 of the front sled subassembly of FIG. 30.
Figure 34:
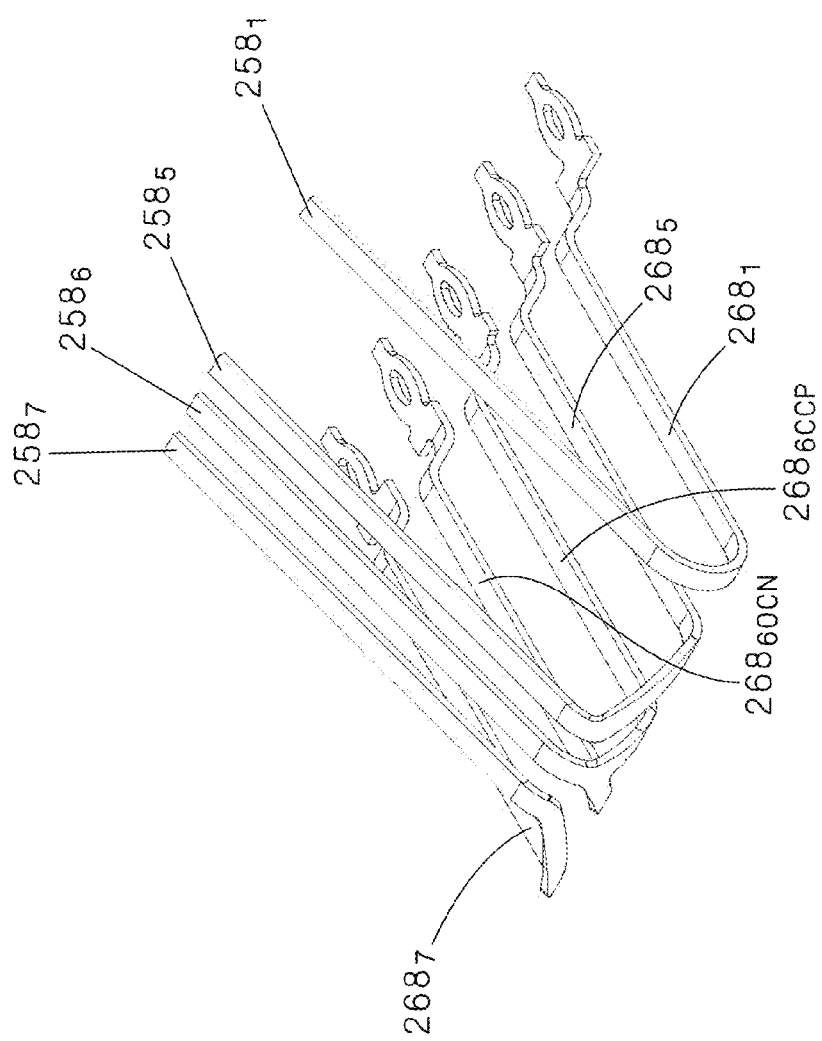
FIG. 34 illustrates an isometric view of PICs 1, 5, 6 and 7 of the front sled subassembly of FIG. 30.
Figure 35:
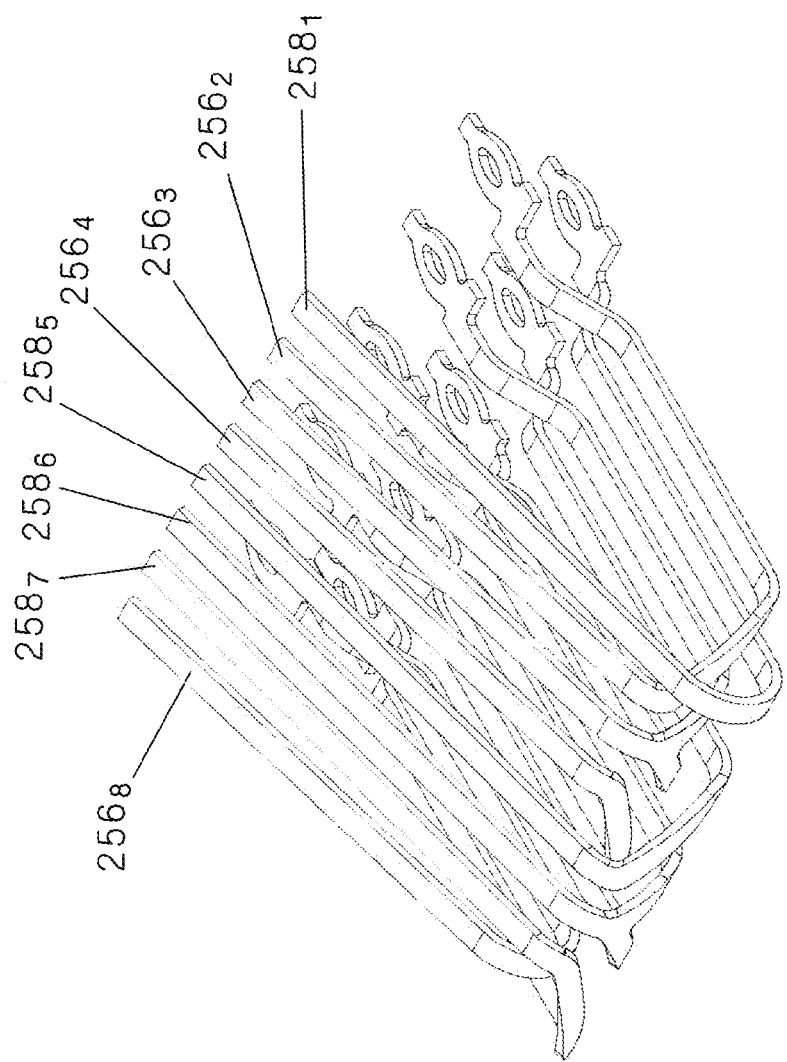
FIG. 35 illustrates an isometric view of PICs 1-8 of the front sled subassembly of FIG. 30.

PICs 256 and 258 (which are shown in greater detail in FIGS. 33-35) use compliant pins 272 to electrically interface with the rigid circuit board 246. The subscript numbers of each complaint pin 272 represents RJ45 pin positions as defined by ANSI/TIA-568-C.2. An extra subscript reference is assigned to the compliant pins of PICs $256_3$ and $258_6$ to differentiate between the offshoot traces used in the compensation network of the present invention ($272_{3OCN}$ or $272_{6OCN}$) and the signal carrying traces ($272_{3CCP}$ or $272_{6CCP}$). Additionally, the PICs 256 and 258 include respective mid-sections 268, with each mid-section 268 employing the same subscript reference scheme as the compliant pins 272. The combination of a mid-section and a respective compliant pin may be referred to as an intermediate section, referring to a section of a PIC that is positioned between the PIC's plug contact region and the PCB.

It is understood by those skilled in the art that coupling between signal traces 2 and 3, 3 and 4, 5 and 6, and 6 and 7 provides a significant amount of the overall crosstalk which is compensated for by a compensation network. Thus, a larger physical separation between the respective PICs of these signal traces has electrical benefits. Furthermore, it is understood by those skilled in the art that coupling between signal traces 1 and 3, 3 and 5, 4 and 6, and 6 and 8 can provide at least some portion of the desired crosstalk compensation. Thus, a small physical separation between the respective PICs of these signal traces has electrical benefits.

The front sled subassembly 244 of the presently described embodiment achieves the desired increased and decreased physical separation between the certain PICs by way of laterally skewing the path of some of the PICs near the mandrel section of the sled 257. Furthermore, due to the front-to-back separation of PICs 256 from PICs 258 in the mandrel area of the sled 257, the skewing allows some of the PICs to crossover other PICs. In addition, the splitting of sonic of the PICs provides further options for desired placement of the PICs with respect to other PICs.

In particular, the crossover 264 of PICs $258_1$ and $256_2$ distances PICs $256_2$ and $256_3$ reducing crosstalk. The split of PIC $256_3$ nears PICs $256_3$ and $258_1$ improving compensation, and nears PICs $256_3$ and $258_5$ improving compensation. The crossover 266 of PICs $256_3$ and $258_5$ nears PICs $258_5$ and $256_3$ improving compensation, and distances PICs $258_3$ and $258_6$ reducing crosstalk. The crossover 278 of PICs $256_4$ and $258_5$ nears PICs $258_5$ and $256_3$ improving compensation, distances PICs $258_5$ and $258_6$ reducing crosstalk, nears PICs $256_4$ and $258_6$ improving compensation, and distances PICs $256_3$ and $256_4$ reducing crosstalk. The crossover 269 of PICs $256_4$ and $258_6$ nears PICs $258_6$ and $256_4$ improving compensation, and distances PICs $256_4$ and $256_3$ reducing crosstalk. The split of PIC $258_6$ nears PICs $258_6$ and $256_8$ improving compensation, and nears PICs $258_6$ and $256_4$ improving compensation. And the crossover 270 of PICs $256_8$ and $258_7$ distances PICs $258_7$ and $258_6$ reducing crosstalk.

Figure 36:
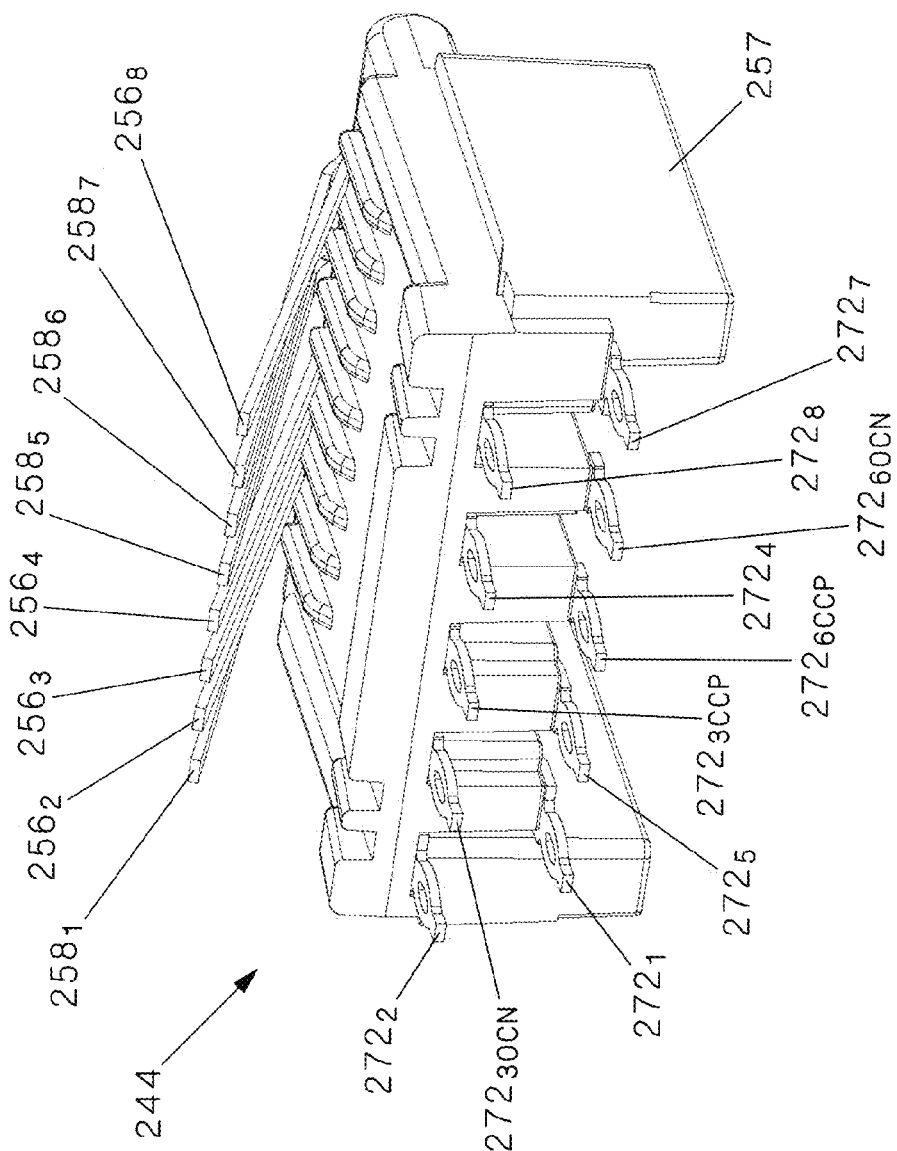
FIG. 36 illustrates a rear isometric view of the front sled subassembly of FIG. 30.
Figure 37:
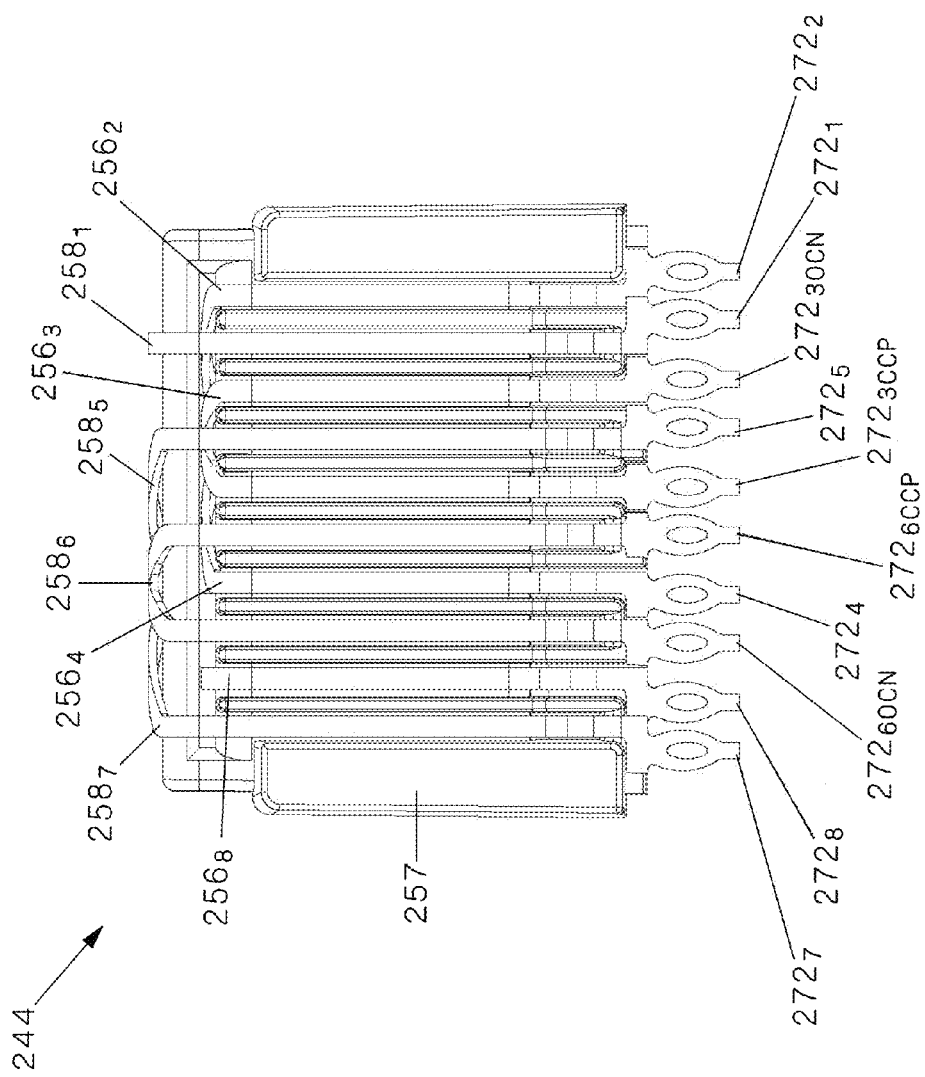
FIG. 37 illustrates a bottom view of the front sled subassembly of FIG. 30.

Furthermore, the resulting PIC routing scheme allows for PIC $258_5$ to run between the OCN path $268_{3OCN}$ and the current carrying path $268_{3CCP}$ of PIC $256_3$, helping to balance the inductive and capacitive compensation being produced between PICs $256_3$ and $258_5$. Similarly, the routing scheme allows for PIC $256_4$ to run between the OCN path $268_{6OCN}$ and the current carrying path $268_{6CCP}$ of PIC $258_6$, helping to balance the inductive and capacitive compensation being produced between PICs $258_6$ and $256_4$. The routing of the PICs 256,258 through and the positioning of the compliant pins 272 in the sled 257 is further illustrated in the rear isometric view of the front sled subassembly 244 shown in FIG. 36 and in the bottom view of the front sled subassembly 244 shown in FIG. 37.

In an embodiment, PICs 256 and 258 can be secured to the plastic sled 257 by staking features. In other embodiments, the sled can comprise a top and bottom portions similar to the sled shown in FIG. 5.

Figure 38:
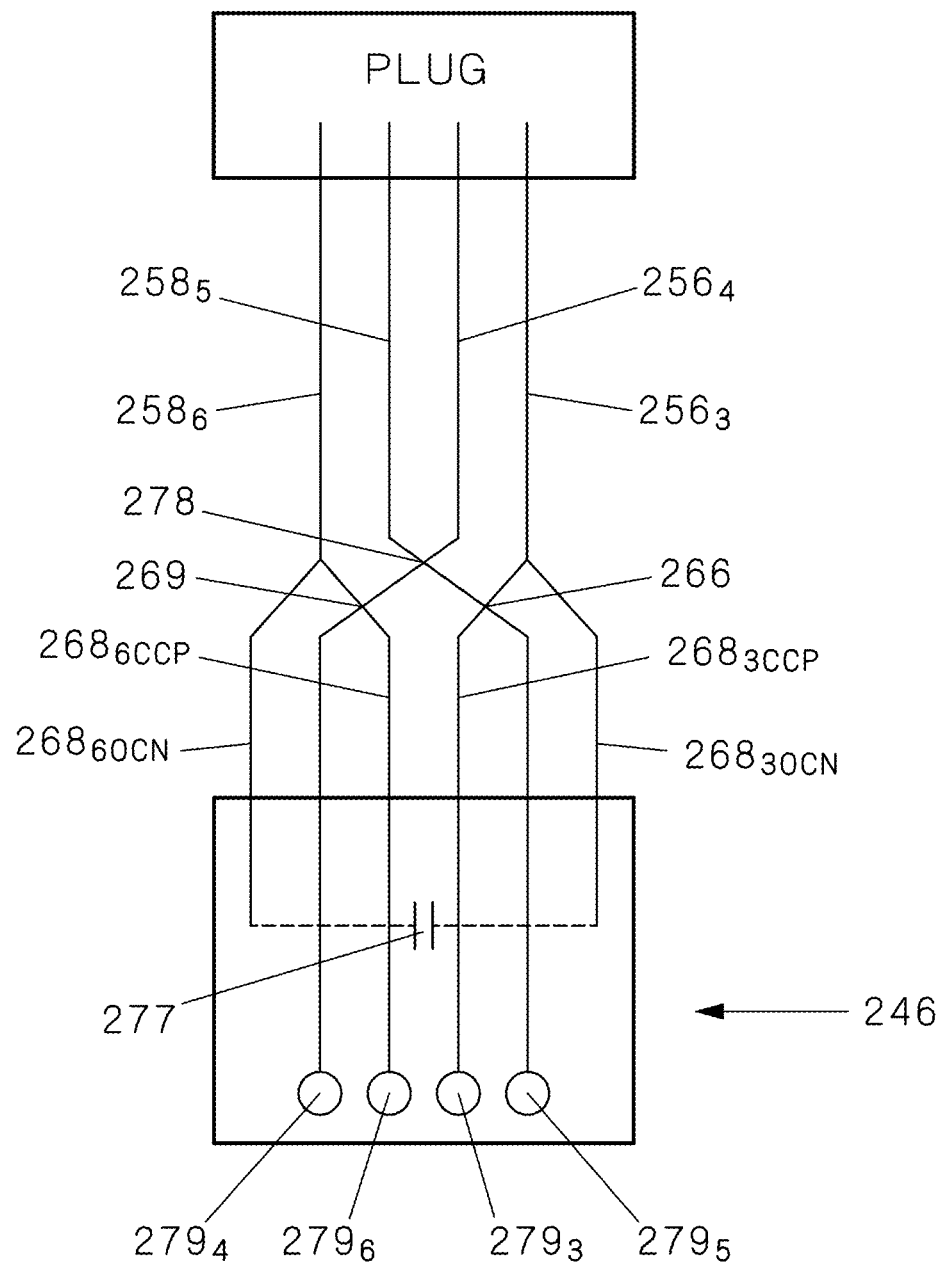
FIG. 38 illustrates a schematic of a compensation network used in the jack of FIG. 30.

FIG. 38 is a schematic of the OCN layout of the currently described embodiment. In short, the OCN paths $268_{3OCN}$ and $268_{6OCN}$ are connected in PCB 246 by way of a shunting capacitive coupling 277. The signal carrying paths $268_{3CCP}$ and $268_{6CCP}$ of PICs $256_3$ and $258_6$, respectively, as well as PIC's $256_4$ and $258_5$ route to their respective IDCs 279 in PCB 246. The OCN of this embodiment functions in a manner that is similar to the embodiment described in FIGS. 3-18. As such, the OCN produces a first combined mutually inductive and capacitive coupling between the respective OCN and signal carrying traces, and a second combined mutually inductive and capacitive coupling between the respective OCN and signal carrying traces. These couplings and the relatively short distance from the offending crosstalk to the beginning of the compensation network may help to allow wire-pair combination 4:5-3:6 to meet standards for Category 6A and/or beyond.

FIGS. 39-48, show a communication jack according to another embodiment of the present invention. This jack is similar to the embodiment shown in FIGS. 29-38, in that the primarily different components are the front sled subassembly 380 and the PCB 384. The front sled subassembly 380 differs from the previous embodiment in that it provides a different skewing/crossing over scheme of the PICs routed therethrough. As a result, while the both of the front sled subassemblies 380 and 244 introduce an OCN, the amount of capacitive and inductive compensation provided by the front Sled subassembly 380 is different from the front sled subassembly 244.

Figure 39:
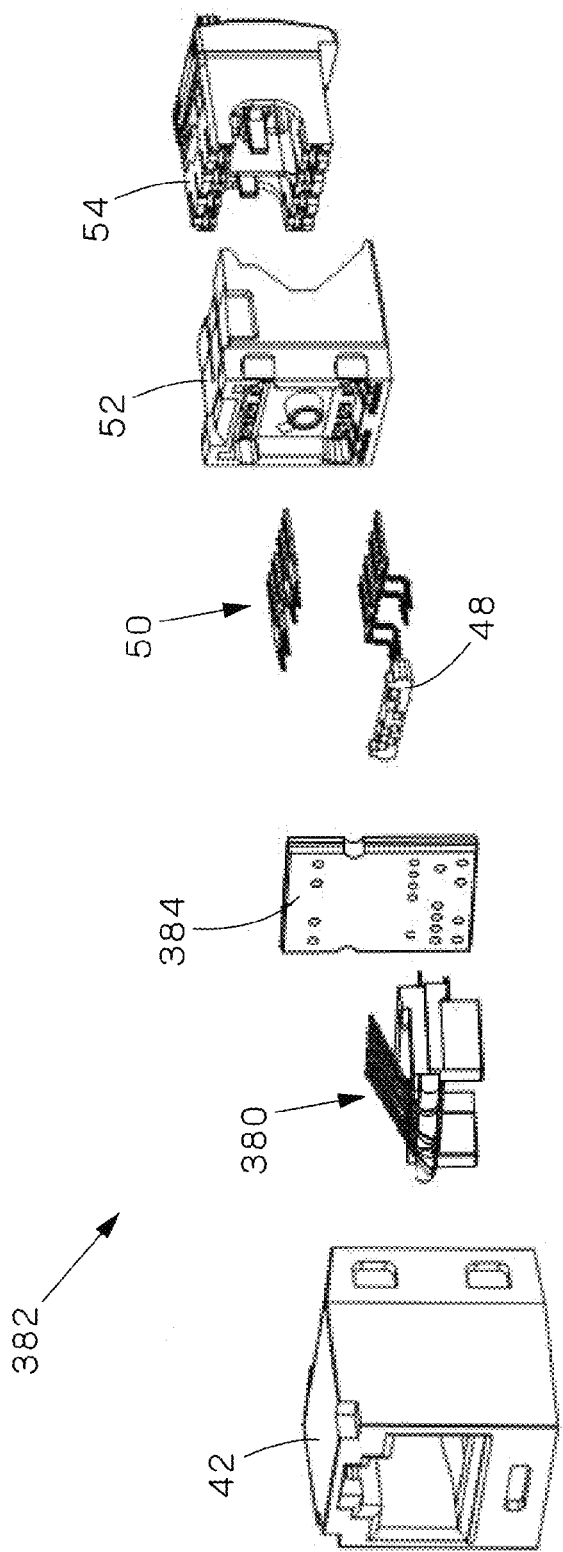
FIG. 39 illustrates an exploded view of another communication jack according to an embodiment of the present invention.

FIG. 39 illustrates an exploded view of the network jack 382, which includes a front housing 42, a front sled subassembly 380, a PCB 384, an IDC support 48, IDCs 50, a rear housing 52, and a wire cap 54. In alternate embodiments, jack 234 can additionally include alien crosstalk-reducing materials such as a foil.

Figure 40:
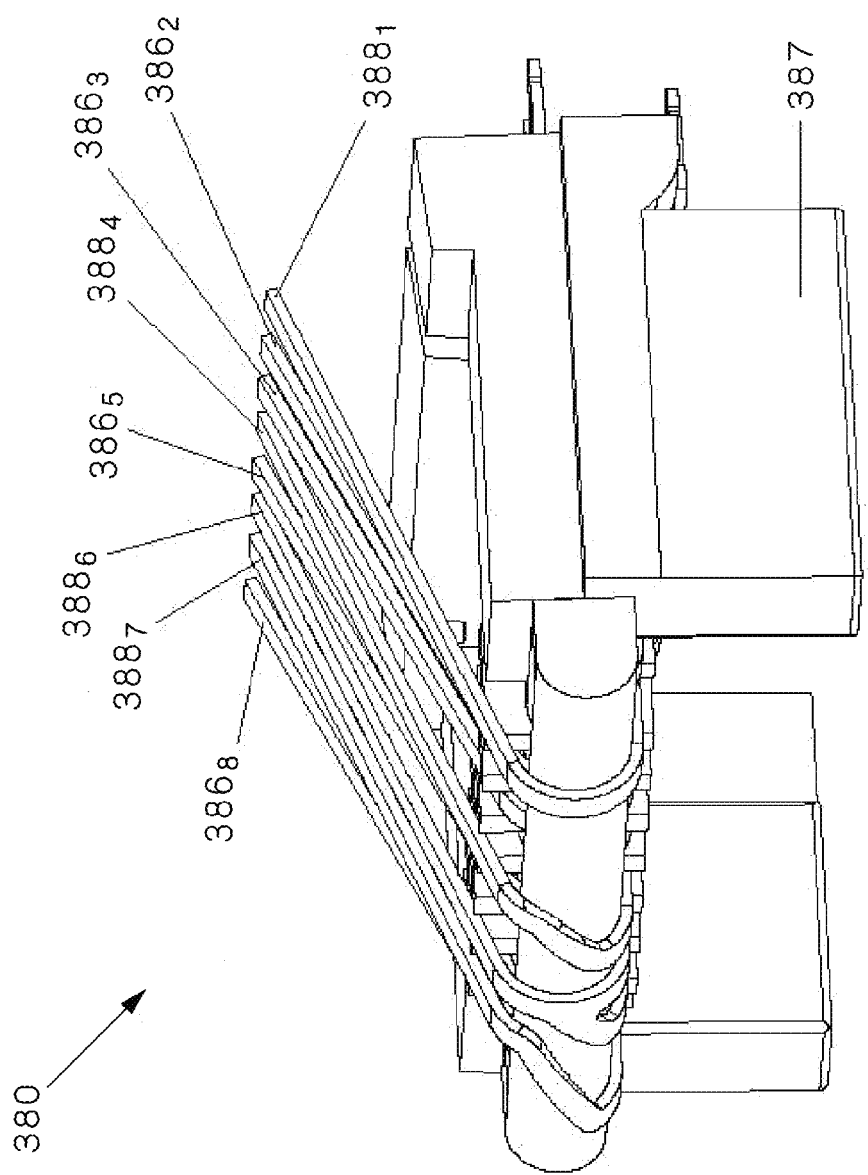
FIG. 40 illustrates a front isometric view of an embodiment of the front sled subassembly of FIG. 39.
Figure 41:
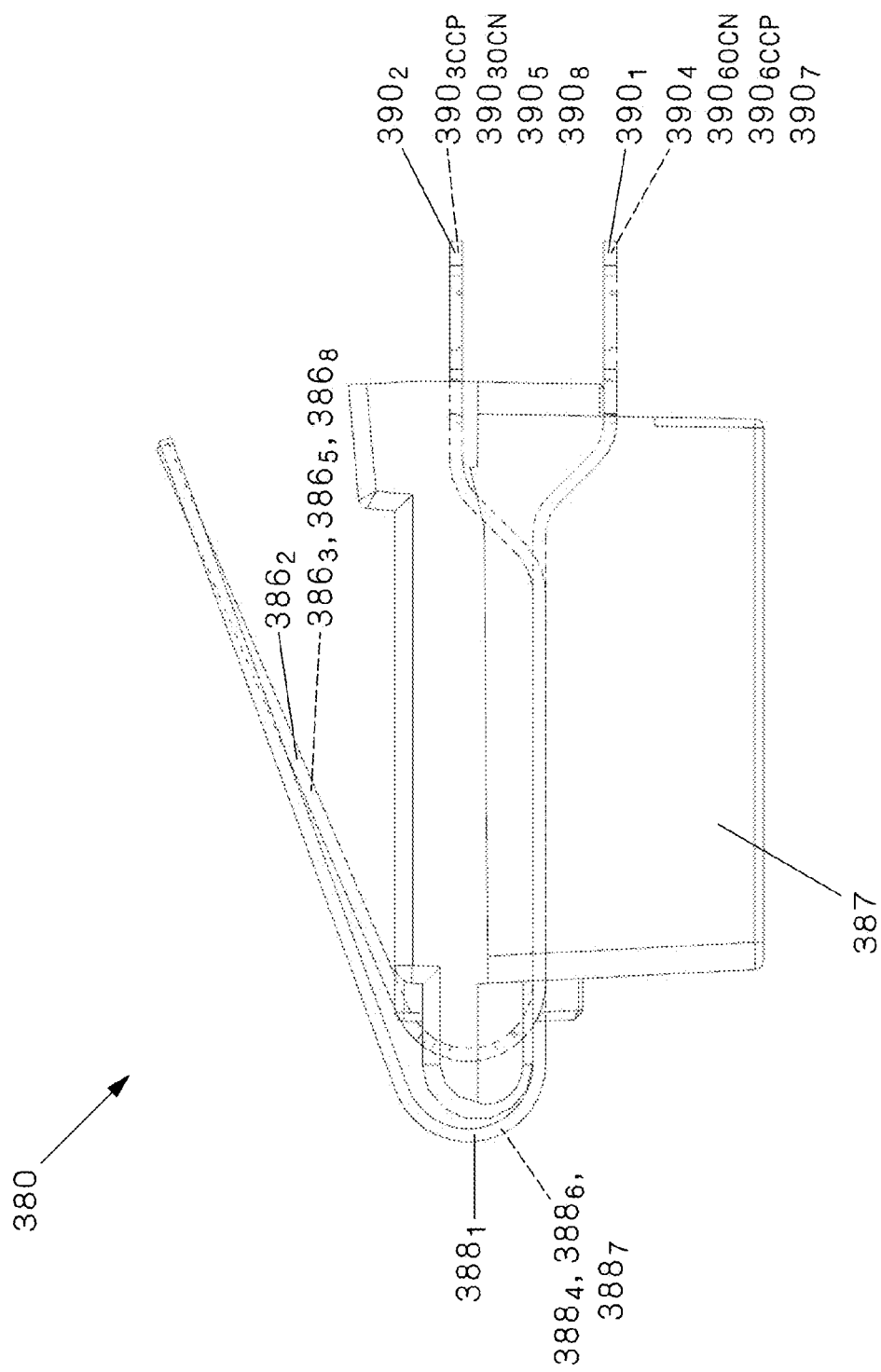
FIG. 41 illustrates a side view of the front sled subassembly of FIG. 40.
Figure 42:
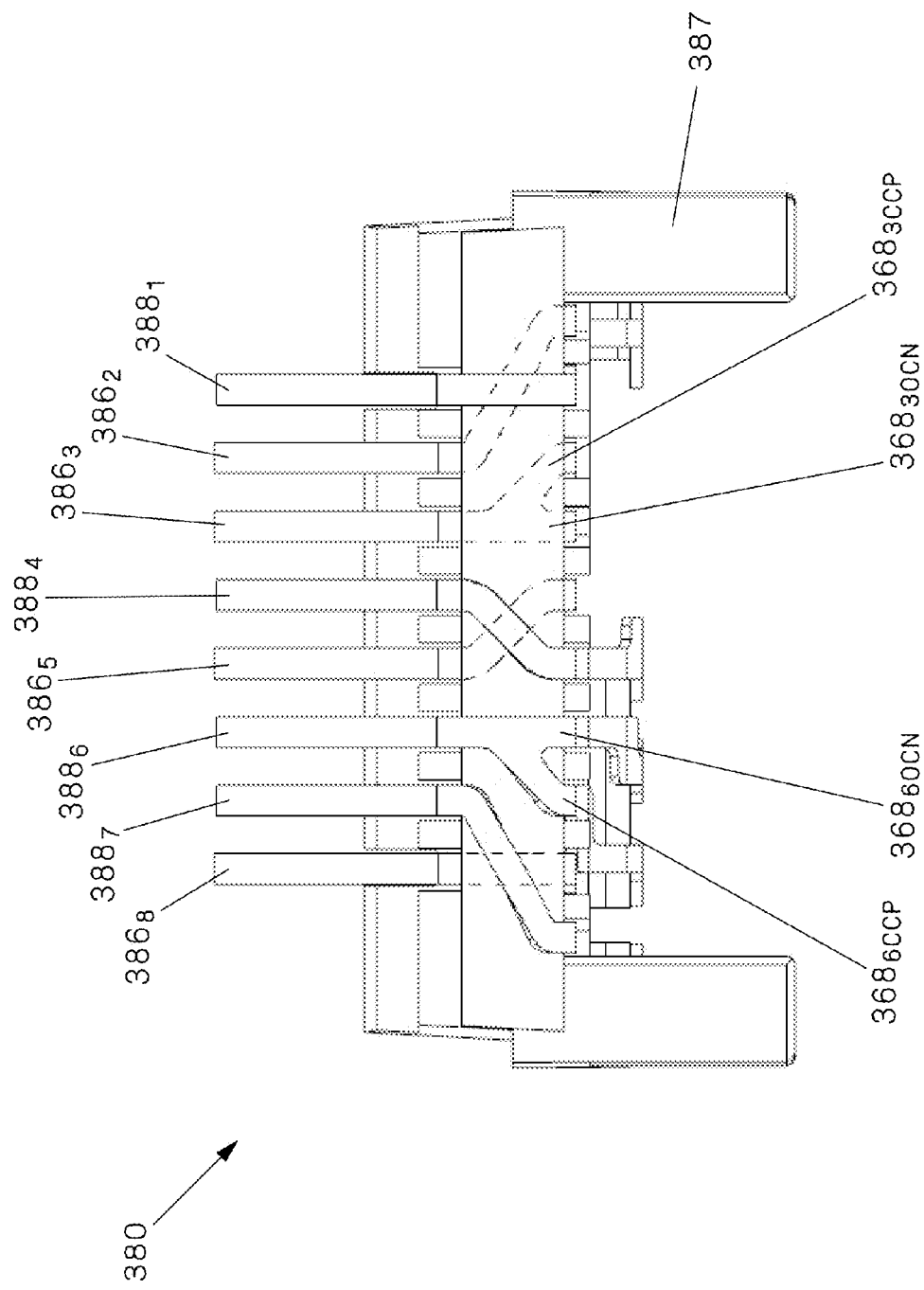
FIG. 42 illustrates a front view of the front sled subassembly of FIG. 40.
Figure 43:
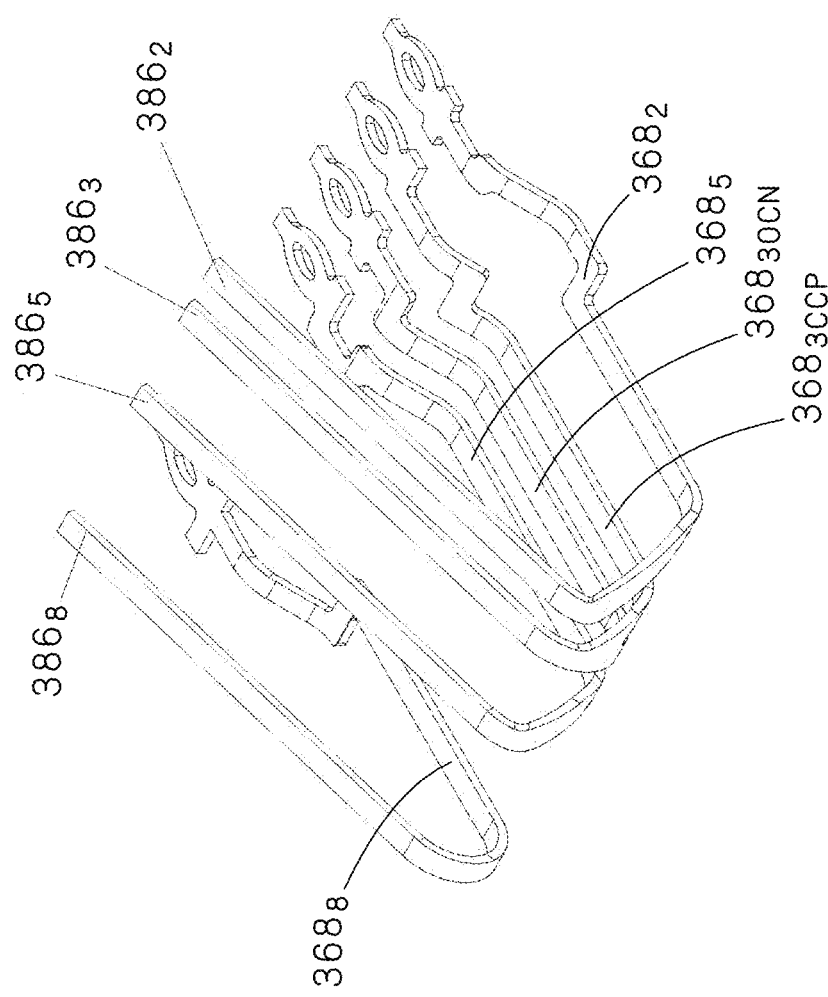
FIG. 43 illustrates an isometric view of PICs 2, 3, 5 and 8 of the front sled subassembly of FIG. 40.
Figure 44:
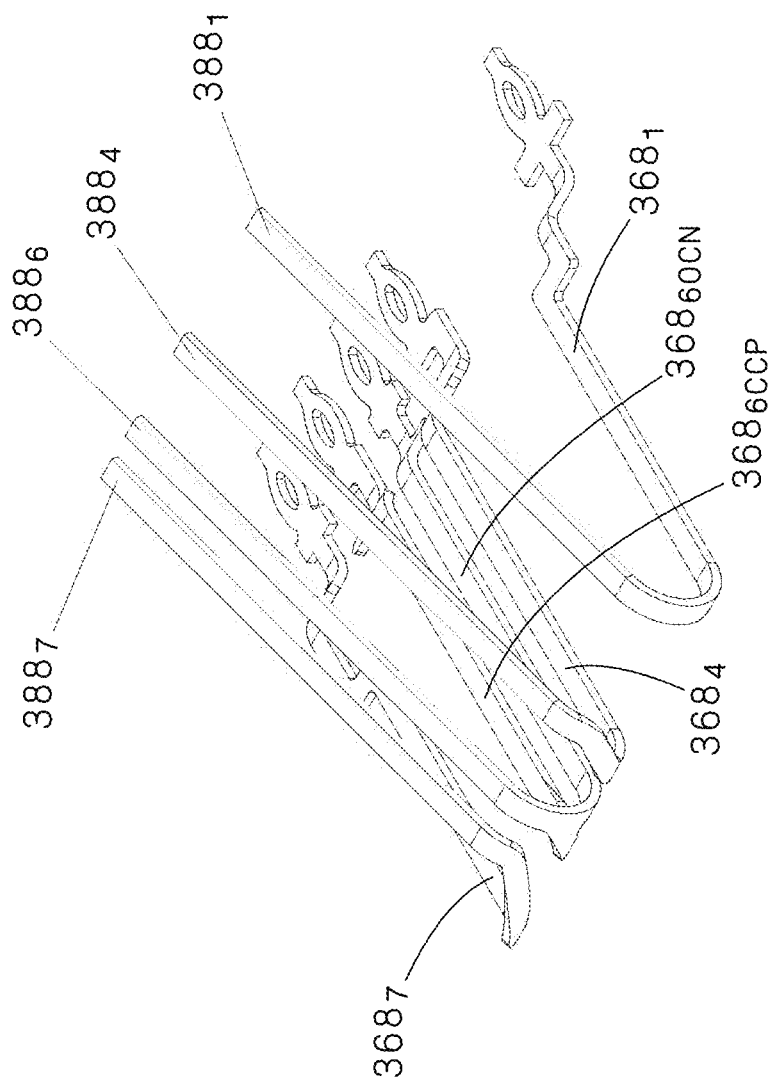
FIG. 44 illustrates an isometric view of PICs 1, 4, 6 and 7 of the front sled subassembly of FIG. 40.
Figure 45:
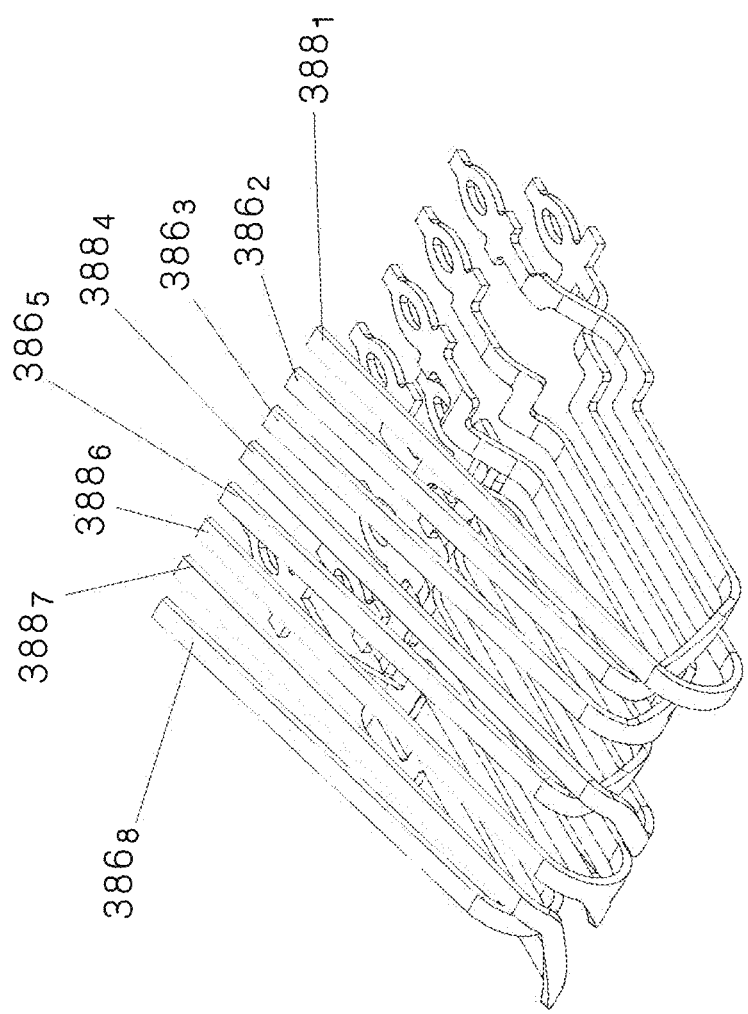
FIG. 45 illustrates an isometric view of PICs 1-8 of the front sled subassembly of FIG. 40.

The front sled subassembly 380 is shown in greater detail in FIGS. 40-42. It includes PICs 386 and 388, and a sled 387. The subscript numbers for each PIC 386 and 388 correspond to the RJ45 pin positions as defined by ANSI/TIA-568-C.2. PICs 256. As shown in FIG. 41, each PIC 386 is wrapped around an inner mandrel and each PIC 388 is wrapped around an outer mandrel. This can be performed during the assembly of the front sled subassembly 380.

PICs 386 and 388 (which are shown in greater detail in FIGS. 43-45) use compliant pins 390 to electrically interface with the rigid circuit board 384. The subscript numbers of each complaint pin 390 represents RJ45 pin positions as defined by ANSI/TIA-568-C.2. An extra subscript reference is assigned to the compliant pins of PICs $386_3$ and $388_6$ to differentiate between the offshoot traces used in the compensation network of the present invention ($390_{3OCN}$ or $390_{6OCN}$) and the signal carrying traces ($390_{3CCP}$ or $390_{6CCP}$). Additionally, the PICs 386 and 388 include respective mid-sections 368, with each mid-section 368 employing the same subscript reference scheme as the compliant pins 390. The combination of a mid-section and a respective complaint pin may be referred to as an intermediate section, referring to a section of a PIC that is positioned between the PIC's plug contact region and the PCB.

A front view of front sled subassembly 380 is shown in FIG. 42. Compared to the embodiment shown in FIG. 32, the front profile of the PICs 386 and 388 has been varied and crossovers corresponding to 266 and 269 in FIG. 32 have been removed in the front sled subassembly 380. The omission of these crossovers varies the overall amount of compensation produced in the nose region of the PICs. Furthermore, it allows for different spacing of complaint pins 390 and the corresponding vias in the PCB 384.

Figure 46:
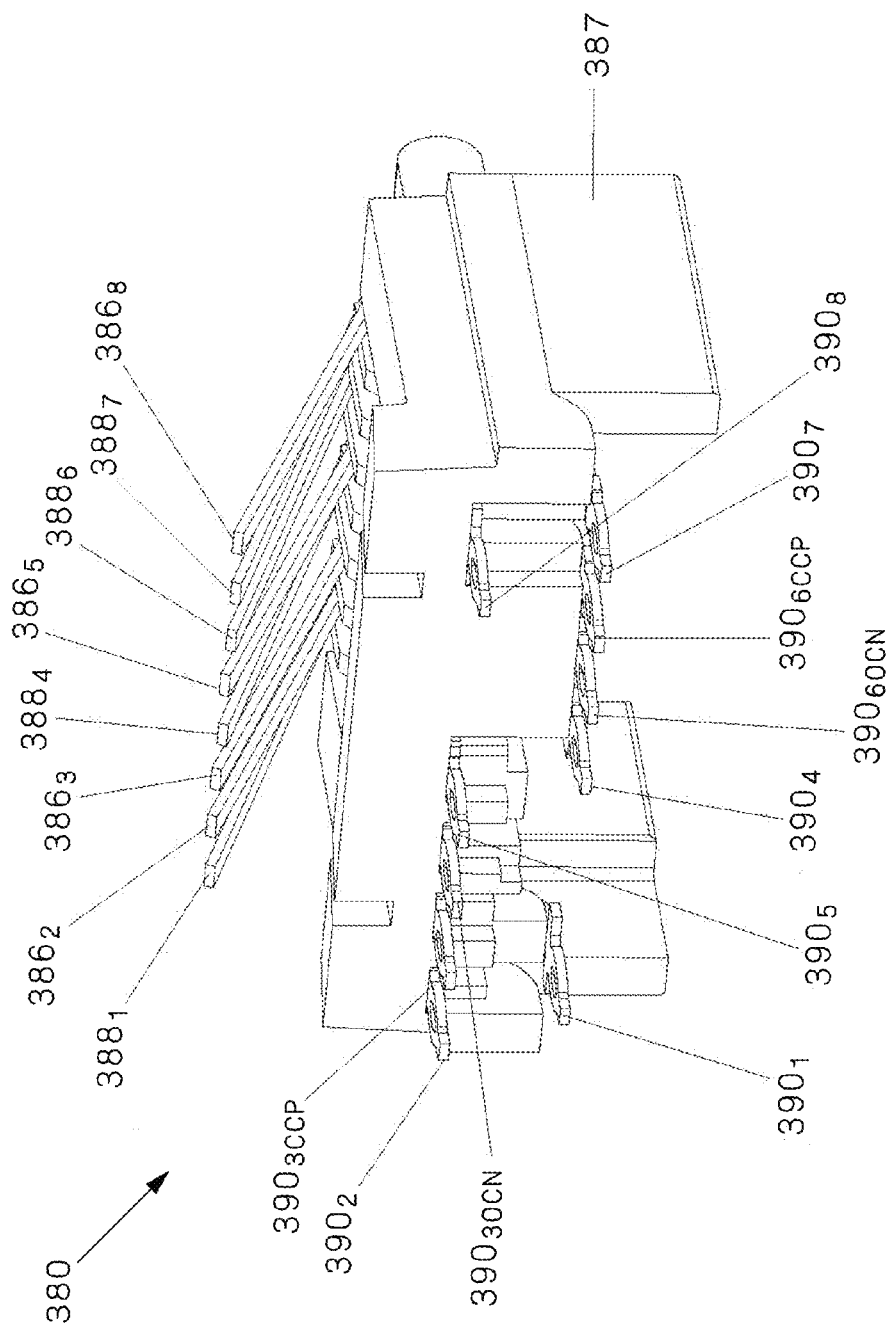
FIG. 46 illustrates a rear isometric view of the front sled subassembly of FIG. 40.
Figure 47:
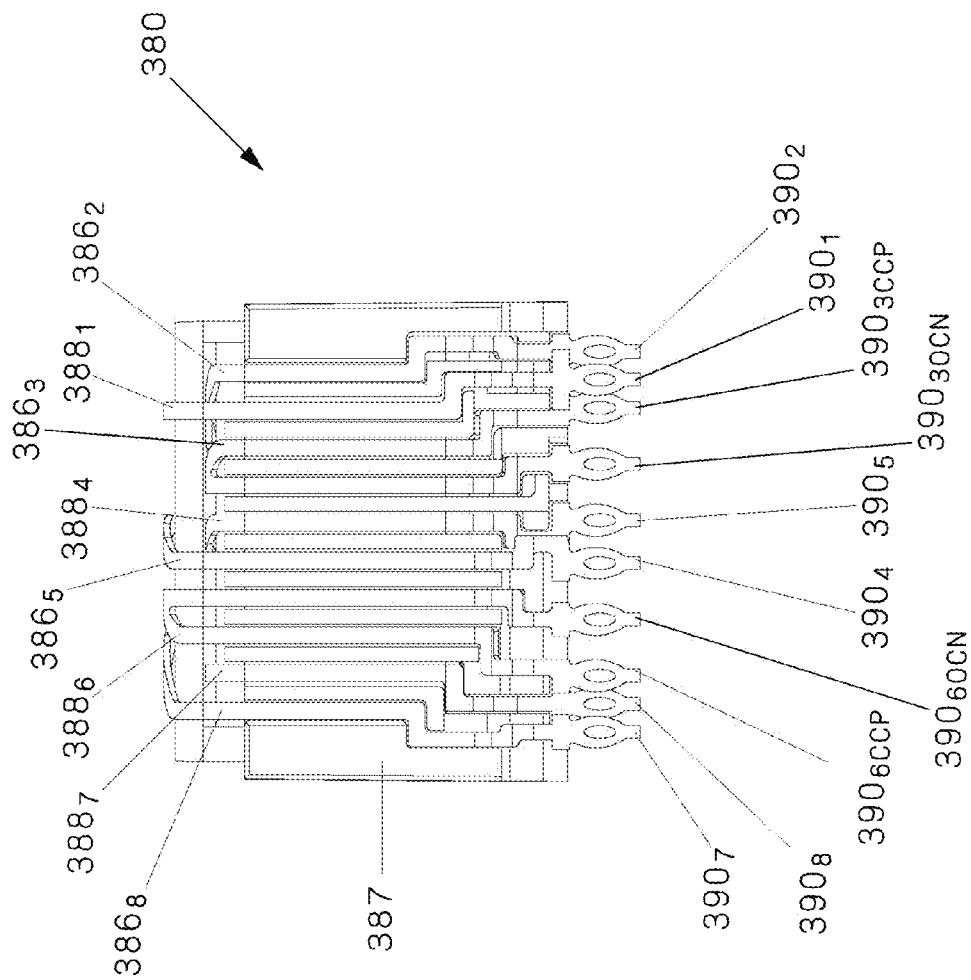
FIG. 47 illustrates a bottom view of the front sled subassembly of FIG. 40.

The routing of the PICs 386,388 through and the positioning of the compliant pins 390 in the sled 387 is further illustrated in the rear isometric view of the front sled subassembly 380 shown in FIG. 46 and in the bottom view of the front sled subassembly 380 shown in FIG. 47.

In an embodiment, PICs 386 and 388 can be secured to the plastic sled 387 by staking features. In other embodiments, the sled can comprise a top and bottom portions similar to the sled shown in FIG. 5.

Figure 48:
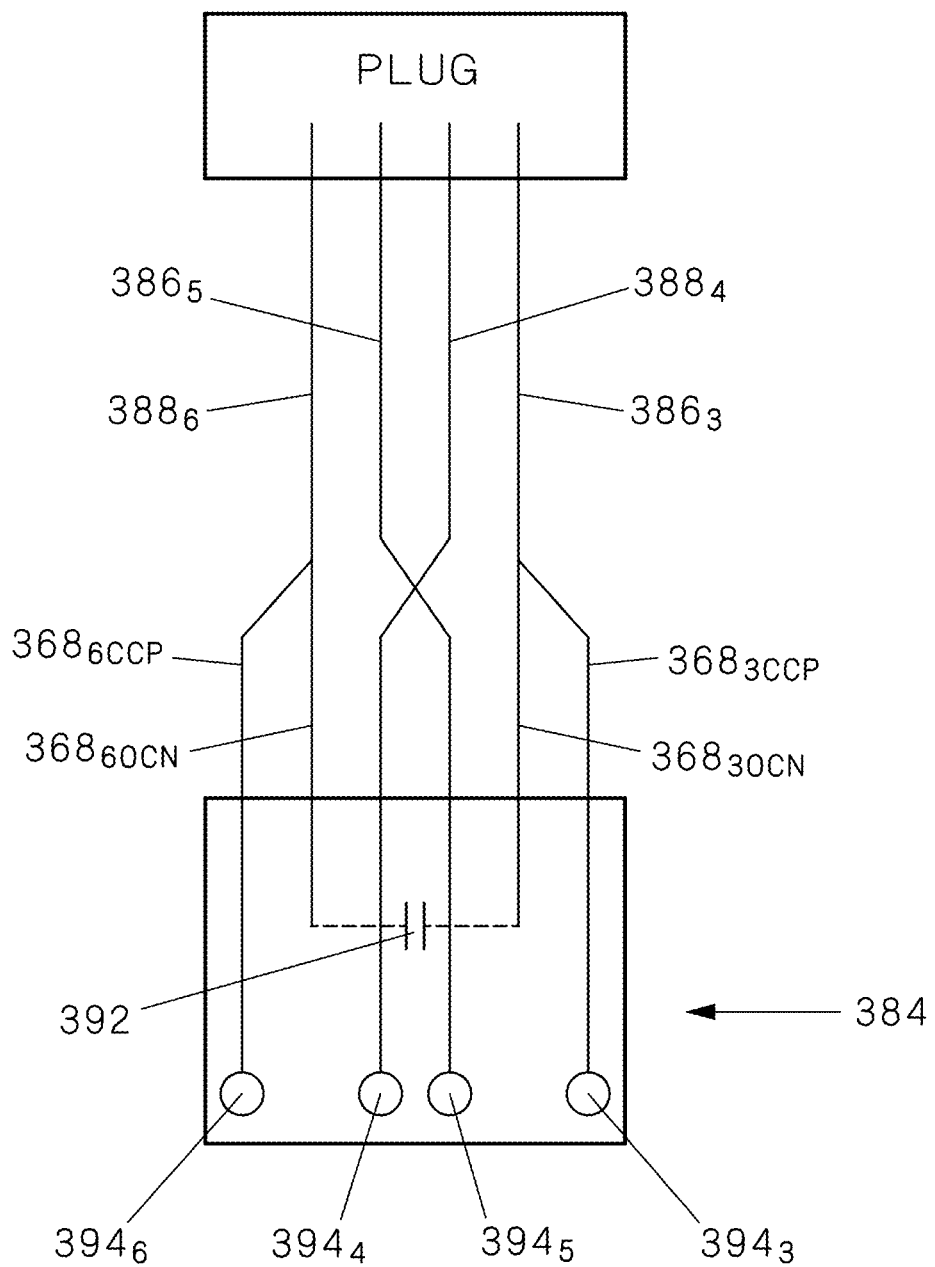
FIG. 48 illustrates a schematic of a compensation network used in the jack of FIG. 40.

FIG. 48 is a schematic of the OCN layout of the currently described embodiment. In short, the OCN paths $368_{3OCN}$ and $368_{6OCN}$ are connected in PCB 384 by way of a shunting capacitive coupling 392. The signal carrying paths $368_{3CCP}$ and $368_{6CCP}$ of PICs $386_3$ and $388_6$, respectively, as well as PIC's $386_4$ and $388_5$ route to their respective IDCs 394 in PCB 384. The OCN of this embodiment functions in a manner that is similar to the embodiment described in FIGS. 3-18. As such, the OCN produces a first combined mutually inductive and capacitive coupling between the respective OCN and signal carrying traces, and a second combined mutually inductive and capacitive coupling between the respective OCN and signal carrying traces. These couplings and the relatively short distance from the offending crosstalk to the beginning of the compensation network may help to allow wire-pair combination 4:5-3:6 to meet standards for Category 6A and/or beyond.

Note that while this invention has been described in terms of several embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and should instead be understood as potentially combinable if such combinations are permissive. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. A communication connector, comprising:
    a printed circuit board (PCB);
    plug interface contacts (PICs) having plug contact mating points, said PICs being connected to said PCB;
    cable connector contacts; and
    a circuitry connecting each of said plug interface contacts from respective said plug contact mating points to respective said cable connector contacts, said circuitry including:
        signal conductors between respective plug contact mating points of respective plug interface contacts and respective cable connector contacts, said signal conductors including a first signal pair and a second signal pair;
        a first combined mutually inductive and capacitive coupling between a first signal conductor of said first signal pair and a second signal conductor of said second signal pair; and
        a shunt capacitive coupling connecting said first signal conductor of said first signal pair and a second signal conductor of said first signal pair, said shunt capacitive coupling enabling said first combined coupling,
    wherein said first combined coupling is generated in part in said PICs and in part on said PCB.

2. The communication connector of claim 1, wherein said circuitry further includes a second combined mutually inductive and capacitive coupling between said second signal conductor of said first signal pair and a first signal conductor of said second signal pair.

3. The communication connector of claim 2, wherein said second combined coupling is generated in part in said PICs and in part on said PCB.

4. The communication connector of claim 3, wherein said first and said second combined couplings occur concurrently.

5. The communication connector of claim 1, wherein each of said PICs includes an intermediate section between respective said plug contact mating point and said PCB, and wherein said first combined coupling is generated in part in said intermediate section of respective said PICs.

6. The communication connector of claim 5, wherein at least one of said PICs includes a first intermediate section and a second intermediate section, said first and said second intermediate section being substantially parallel to one another.

7. The communication connector of claim 6, wherein each of said first and said second intermediate sections include a first end and a second end, said first end of said first intermediate section and said first end of said second intermediate section being connected to each other, said second end of said first intermediate section being connected to respective said cable connector contact, said second end of said second intermediate section being connected to said shunt capacitive coupling.

8. The communication connector of claim 1, wherein said circuitry further includes a first offshoot trace, and wherein said first signal conductor of said first signal pair is connected to said shunt capacitive coupling via said first offshoot trace.

9. The communication connector of claim 8, wherein said first combined coupling is at least partially distributed between said first offshoot trace and said second signal conductor of said second signal pair.

10. The communication connector of claim 8, wherein respective PIC of said first signal conductor of said first signal pair includes a first and a second intermediate sections between respective said plug contact mating point and said PCB, said first and said second intermediate section being substantially parallel to one another, said first intermediate section forming said first signal conductor of said first signal pair and said second intermediate section forming said first offshoot trace.

11. The communication connector of claim 1 further including a flexible printed circuit board connected to said PICs.

12. A communication connector, comprising:
 plug interface contacts;
 cable connector contacts; and
 a circuitry inclusive of and connecting respective said plug interface contacts to respective said cable connector contacts, said circuitry including signal conductors inclusive of and between respective said plug interface contacts and respective said cable connector contacts, said signal conductors including a first signal conductor pair and a second signal conductor pair, said circuitry including a first network with a first combined mutually inductive and capacitive coupling between a first signal conductor of said first signal conductor pair and a second conductor of said second signal conductor pair, said circuitry further including a second network with a second combined mutually inductive and capacitive coupling between a second signal conductor of said first signal conductor pair and a first signal conductor of said second signal conductor pair, and a shunt capacitive coupling connecting said first signal conductor of said first signal conductor pair and said second signal conductor of said first signal conductor pair, said shunt capacitive coupling enabling said first network and said second network,
 wherein each of said plug interface contacts includes a plug contact, a printed circuit board contact, and an intermediate contact connecting respective said plug contact to respective said printed circuit board contact, at least one of said first network and said second network including at least some of said intermediate contacts.

13. The communication connector of claim 12, wherein at least one said intermediate contact includes a split contact.

14. The communication connector of claim 12, further including a printed circuit board connecting said plug interface contacts and said cable connector contacts, at least one of said first network and said second network including said printed circuit board.

15. The communication connector of claim 12, further including a flexible printed circuit board connected to said plug interface contacts.

16. The communication connector of claim 15, wherein said flexible printed circuit board includes a compensation element between said first signal conductor of said first signal conductor pair and said second signal conductor of said second signal conductor pair.

17. The communication connector of claim 16, wherein said flexible printed circuit board includes a compensation element between said first signal conductor of said second signal conductor pair and said second signal conductor of said first signal conductor pair.

18. The communication connector of claim 12, further including a capacitive coupling connecting said first signal conductor of said second signal conductor pair and said second signal conductor of said second signal conductor pair.

19. A communication system, comprising:
 communication equipment; and
 a communication connector connected to said communication equipment, said communication connector including plug interface contacts, cable connector contacts, and
 a circuitry inclusive of and connecting respective said plug interface contacts to respective said cable connector contacts, said circuitry including signal conductors inclusive of and between respective said plug interface contacts and respective said cable connector contacts, said signal conductors including a first signal conductor pair and a second signal conductor pair, said circuitry including a first network with a first combined mutually inductive and capacitive coupling between a first signal conductor of said first signal conductor pair and a second conductor of said second signal conductor pair, said circuitry further including a second network with a second combined mutually inductive and capacitive coupling between a second signal conductor of said first signal conductor pair and a first signal conductor of said second signal conductor pair, and a shunt capacitive coupling connecting said first signal conductor of said first signal conductor pair and said second signal conductor of said first signal conductor pair, said shunt capacitive coupling enabling said first network and said second network,
 wherein each of said plug interface contacts includes a plug contact, a printed circuit board contact, and an intermediate contact connecting respective said plug contact to respective said printed circuit board contact, at least one of said first network and said second network including at least some of said intermediate contacts.

20. The communication system of claim 19, wherein at least one said intermediate contact includes a split contact.

21. The communication system of claim 19, further including a printed circuit board connecting said plug interface contacts and said cable connector contacts, at least one of said first network and said second network including said printed circuit board.

22. The communication system of claim 19, further including a flexible printed circuit board connected to said plug interface contacts.

23. The communication system of claim 22, wherein said flexible printed circuit board includes a compensation element between said first signal conductor of said first signal conductor pair and said second signal conductor of said second signal conductor pair.

24. The communication system of claim 23, wherein said flexible printed circuit board includes a compensation element between said first signal conductor of said second signal conductor pair and said second signal conductor of said first signal conductor pair.

25. The communication system of claim 19, further including a capacitive coupling connecting said first signal conductor of said second signal conductor pair and said second signal conductor of said second signal conductor pair.

* * * * *